(12) United States Patent
Nam

(10) Patent No.: US 11,728,329 B2
(45) Date of Patent: Aug. 15, 2023

(54) SEMICONDUCTOR DEVICE AND METHOD FOR FABRICATING THE SAME

(71) Applicant: SK hynix Inc., Gyeonggi-do (KR)

(72) Inventor: Sang Yun Nam, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/370,559

(22) Filed: Jul. 8, 2021

(65) Prior Publication Data

US 2022/0216197 A1    Jul. 7, 2022

(30) Foreign Application Priority Data

Jan. 5, 2021 (KR) .......................... 10-2021-0000858

(51) Int. Cl.
*H01L 27/02* (2006.01)
*H01L 21/74* (2006.01)
*H01L 23/00* (2006.01)
*H01L 49/02* (2006.01)

(52) U.S. Cl.
CPC .......... *H01L 27/0255* (2013.01); *H01L 21/74* (2013.01); *H01L 23/562* (2013.01); *H01L 28/90* (2013.01)

(58) Field of Classification Search
None
See application file for complete search history.

(56) References Cited

U.S. PATENT DOCUMENTS

| 8,853,762 B2 | 10/2014 | Tu et al. | |
| 2007/0102746 A1* | 5/2007 | Won | H01L 21/76816 257/E27.087 |
| 2013/0175590 A1* | 7/2013 | Kim | H01L 21/76224 257/E29.345 |
| 2017/0018709 A1* | 1/2017 | Wu | H01L 45/1233 |

* cited by examiner

*Primary Examiner* — Bo B Jang
(74) *Attorney, Agent, or Firm* — IP & T Group LLP

(57) ABSTRACT

A semiconductor device includes: a capacitor disposed over a substrate including a lower electrode, a dielectric layer, and an upper electrode; and a discharge structure spaced apart from the capacitor, connected to the upper electrode of the capacitor, and suitable for discharging, to the substrate, a charge induced from a plasma process for forming the upper electrode of the capacitor.

14 Claims, 28 Drawing Sheets

SEMICONDUCTOR DEVICE AND METHOD FOR FABRICATING THE SAME

CROSS-REFERENCE TO RELATED APPLICATIONS

The present application claims priority to Korean Patent Application No. 10-2021-0000858, filed on Jan. 5, 2021, which is incorporated herein by reference in its entirety.

BACKGROUND

1. Field

Various embodiments of the present invention relate to a semiconductor device and a method for fabricating the same and, more particularly, to a semiconductor device including a discharge structure that can discharge a plasma-induced charge to a substrate and methods for fabricating the same.

2. Description of the Related Art

Fabrication of a semiconductor device includes multiple steps of plasma processes. The plasma processes are mainly applied during a deposition or an etching process. However, a plasma-induced charge from the plasma processes may cause degradation of electrical performance of the semiconductor device. New improved solutions are needed.

SUMMARY

Embodiments of the present invention are directed to a semiconductor device that can improve a performance of the semiconductor device by preventing plasma induced damage (PID) and methods for fabricating the same.

In accordance with an embodiment of the present invention, a semiconductor device includes a capacitor disposed on a substrate and including a lower electrode, a dielectric layer, and an upper electrode, and a discharge structure spaced apart from the capacitor, connected to the upper electrode of the capacitor and suitable for discharging, to the substrate, a charge induced from a plasma process for forming the upper electrode of the capacitor.

In accordance with another embodiment of the present invention, a semiconductor device includes a substrate including a first region and a second region, a capacitor disposed on the first region of the substrate and including a lower electrode, a dielectric layer, and an upper electrode, and a discharge structure spaced apart from the capacitor, connected to the upper electrode of the capacitor and suitable for discharging, to the second region of the substrate, a charge induced from a plasma process for forming the upper electrode of the capacitor.

In accordance with yet another embodiment of the present invention, a method for fabricating a semiconductor device includes providing a substrate which includes a first region and a second region, forming a capacitor of which a lower electrode, a dielectric layer, and an upper electrode are stacked over the first region of the substrate, and forming a discharge structure which is spaced apart from the capacitor over the second region of the substrate and connects to the upper electrode of the capacitor.

Embodiments of the present invention has an effect of improving performance of the semiconductor device by preventing plasma induced damage (PID).

DETAILED DESCRIPTION

Figure 1:
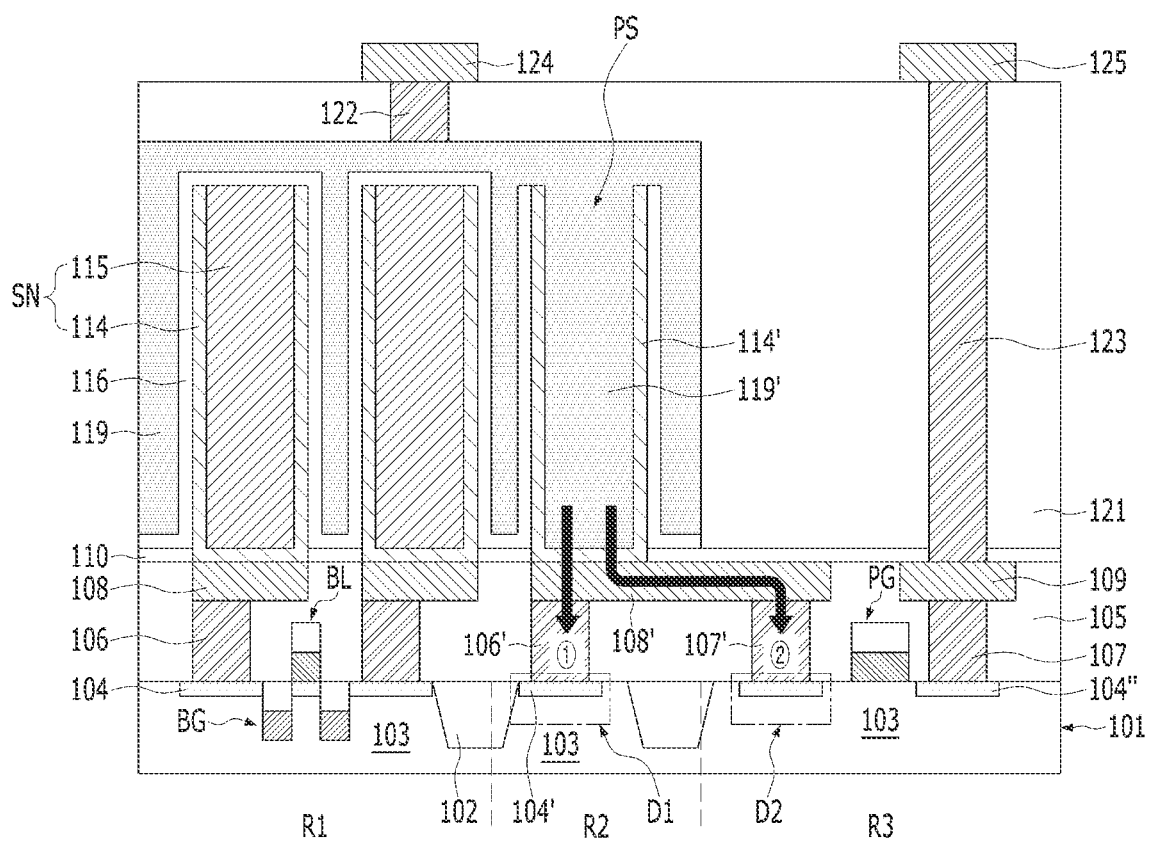
FIG. 1 is a cross-sectional diagram illustrating a semiconductor device in accordance with an embodiment of the present invention.

Various embodiments described herein will be described with reference to cross-sectional views, plane views and block diagrams, which are ideal schematic views of the present invention. Thus, the structures of the drawings may be modified by fabricating techniques and/or tolerances. The embodiments of the present invention are not limited to the specific structures shown in the drawings, but include any changes in the structures that may be produced according to the fabricating process. Accordingly, the regions and the shapes of the regions illustrated in the drawings are intended to illustrate specific structures of regions of the elements, and are not intended to limit the scope of the invention.

FIG. 1 is a cross-sectional view of a semiconductor device in accordance with an embodiment of the present invention.

Referring to FIG. 1, a substrate 101 may include a first region R1, a second region R2, and a third region R3. A capacitor may be disposed on the substrate 101 of the first region R1. The capacitor may include a lower electrode SN, a dielectric layer 116, and an upper electrode 119. The first region R1 and the capacitor may be electrically connected through a first contact plug 106 and a second contact plug 108. A discharge structure PS may be disposed on the substrate 101 of the second region R2. The discharge structure PS may include a first diode D1, a first discharge contact plug 106', a second discharge contact plug 108', a first electrode 114', and a second electrode 119'. A second diode D2, a peripheral gate PG, a first peripheral metal line 109, and a second peripheral metal line 125 may be disposed on the substrate 101 of the third region R3.

The substrate 101 may be a material suitable for semiconductor processing. The substrate 101 may include a semiconductor substrate. The substrate 101 may include a silicon-containing material. The substrate 101 may include, for example, silicon, polysilicon, amorphous silicon, silicon germanium, monocrystalline silicon germanium, polycrystalline silicon germanium, carbon-doped silicon, or a combination thereof or a multi-layer of two or more of them. The substrate 101 may also be made of another semiconductor material such as germanium. The substrate 101 may be made of a III/V-group semiconductor substrate, that is, a compound semiconductor substrate, e.g., gallium arsenide (GaAs). The substrate 10 1 may include a Silicon On Insulator (SOI) substrate.

The first region R1 of the substrate 101 may include a cell region in which devices such as a gate, a bit line, and a capacitor are formed. The second region R2 may include a discharge region where a plasma-induced charge is discharged to a substrate. The third region R3 may include a peripheral region for controlling operations of the devices formed in the first region R1. In an embodiment, the second region R2 may be included in a dummy region located between the cell region and the peripheral region.

The first region R1, the second region R2, and the third region R3 may be divided by an isolation layer 102. Each of the regions R1 to R3 may include an active region 103 that is defined by the isolation layer 102. The isolation layer 102 may be a region formed through a Shallow Trench Isolation (STI) process. The isolation layer 102 may include, for example, silicon oxide, silicon nitride, or a combination thereof.

A gate structure BG may be disposed in the first region R1. The gate structure BG may be of a buried gate structure. The gate structure BG may be located at a lower level than an upper surface of the substrate 101 in accordance with FIG. 1. However, the present invention is not limited thereto. The present invention can be applied with any type of a gate structure such as a recess gate, a fin gate, a planar gate and so forth.

A source/drain region 104 may be disposed on the substrate 101 between on both sides the gate structures BG.

A bit line structure BL may be disposed between the gate structures BG on the substrate 101. The bit line structure BL may be formed to be in direct contact with the source/drain region 104 which is located between the gate structures BG.

A first insulation layer 105 may be formed over the substrate 101. The first insulation layer 105 may be formed commonly over the first region R1, the second region R2, and the third region R3 of the substrate. The first insulation layer 105 may include an insulation material. The first insulation layer 105 may be a single or a multi-layer. The first insulation layer 105 may include multiple layers of insulation materials having the same etch selectivity. The first insulation layer 105 may include multiple layers of insulation materials having different etch selectivity. The first insulation layer 105 may include, for example, nitride, oxide, oxynitride, or a combination thereof.

The first contact plug 106 and the second contact plug 108 may be disposed to pass through the first insulation layer 105 of the first region R1 to contact the substrate 101. The first contact plug 106 may be formed to contact the source/drain region 104. An upper surface of the second contact plug 108 and an upper surface of the first insulation layer 105 may be located at the same level. The first contact plug 106 may include a semiconductor material. The second contact plug 108 may include a metal.

Various embodiments of the present invention illustrate the first contact plug 106 and the second contact plug 108 passing through the first insulation layer 105. However, the present invention is not limited thereto. The first insulation layer 105 may include a multi-layer of insulation materials suitable for forming a separate insulation layer for the first contact plug 106 and the second contact plug 108.

A line width of the second contact plug 108 may be adjusted to be wider than a line width of the first contact plug 106. In the present embodiments, the upper surface of the first contact plug 106 is shown to be covered by the second contact plug 108, but the present embodiment is not limited thereto. If necessary, the first contact plug 106 and the second contact plug 108 may be partially overlapped within a limit that can be electrically connected.

One end of the first contact plug 106 may be in direct contact with the source/drain region 104 of the substrate 101 and the other end of the first contact plug 106 may be in direct contact with the second contact plug 108. One end of the second contact plug 108 may be in direct contact with the other end of the first contact plug 106 and the other end of the second contact plug 108 may be in direct contact with the lower electrode SN of a capacitor.

An etch stop layer 110 may be formed on the first insulation layer 105. The etch stop layer 110 may be formed on the first insulation layer 105 commonly over the first region R1, the second region R2, and the third region R3. The etch stop layer 110 may be formed to protect lower layers, including the first insulation layer 105, during subsequent processes such as an upper layer etching process. The etch stop layer 110 may be formed of a material having an etch selectivity with respect to a sacrificial layer 111A. The etch stop layer 110 may include nitride, oxide, oxynitride, or a combination thereof.

A capacitor may be disposed on the second contact plug 108 of the first region R1. The capacitor may be formed of the lower electrode SN, the dielectric layer 116, and the upper electrode 119. The lower electrode SN, the dielectric layer 116, and the upper electrode 119 may be stacked. The dielectric layer 116 may be disposed between the lower electrode SN, and the upper electrode 119. The capacitor and in particular, the lower electrode SN of the capacitor, may be in contact with the first region R1 of the substrate 101 through the first and second contact plugs 106 and 108. The capacitor may be located at a higher level than the upper surface of the first insulation layer 105.

The lower electrode SN may include a structure of a first lower electrode 114 and a second lower electrode 115. The lower electrode SN may be of a pillar-shape. The lower electrode SN may include the first lower electrode 114 of a cylinder-shape and the second lower electrode 115 of a pillar-shape. The second lower electrode 115 may be formed inside the first lower electrode 114. The first lower electrode 114 and the second lower electrode 115 may be made of the same or different materials. The first lower electrode 114 and the second lower electrode 115 may be of a metal-base material. The metal-base material may refer to a metal-containing material. In another embodiment of the present invention, the first lower electrode 114 may be of a metal-base material and the second lower electrode 115 may be of a silicon-base material. The silicon-base material may refer to a silicon-containing material. For example, the first lower electrode 114 and the second lower electrode 115 may be of a titanium nitride (TiN). The first lower electrode 114 may be of a titanium nitride (TiN) and the second lower electrode 115 may be of a doped polysilicon. The doped polysilicon may refer to the polysilicon doped with conductive impurities.

The dielectric layer 116 may include a single-layer structure, a multi-layered structure, or a laminated structure. The dielectric layer 116 may be of a doping structure or an intermixing structure. The dielectric layer 116 may include a high dielectric (high-k) material. The dielectric layer 116 may have a higher dielectric constant than a silicon oxide ($SiO_2$). In an embodiment, the silicon oxide may have a dielectric constant of approximately 3.9, and the dielectric layer 116 may include a material having a dielectric constant of 4 or more. The high-k material may have a dielectric constant of approximately 20 or more. The high-k material may include, for example, hafnium oxide ($HfO_2$), zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanate ($SrTiO_3$). In another embodiment of the present invention, the dielectric layer 116 may be formed of a multiple layer of the high-k materials. The dielectric layer 116 may include a zirconium-base oxide layer. The dielectric layer 116 may include a stack structure of zirconium oxide ($ZrO_2$). The stack structure of zirconium oxide may include Za($ZrO_2$/Al2$O_3$) or ZAZ($ZrO_2$/$Al_2O_3$/$ZrO_2$). ZA may be a stack structure in which aluminum oxide is stacked on zirconium oxide. ZAZ may be a stack structure in which zirconium oxide, aluminum oxide and zirconium oxide are sequentially stacked. Each of $ZrO_2$, the ZA and ZAZ structures may also be referred to as a "zirconium oxide-based layer ($ZrO_2$-base layer)". In some embodiments, the dielectric layer 116 may be formed of hafnium (Hf)-based oxide. For example, the stack structure including the hafnium oxide ($HfO_2$) may include a HA ($HfO_2$/$Al_2O_3$) structure in which aluminum oxide is stacked on hafnium oxide, or a HAH ($HfO_2$/$Al_2O_3$/$HfO_2$) structure in which hafnium oxide, aluminum oxide and hafnium oxide are sequentially stacked. Each of the $HfO_2$, the HA and HAH structures may also be referred to as a "hafnium oxide ($HfO_2$)-based layer".

The aluminum oxide $Al_2O_3$ in the ZA, ZAZ, HA and HAH structures may have a higher bandgap than the zirconium oxide ($ZrO_2$) and the hafnium oxide ($HfO_2$). The aluminum oxide ($Al_2O_3$) may have a dielectric constant that is lower than the dielectric constants of the zirconium oxide ($ZrO_2$) and the hafnium oxide ($HfO_2$). Accordingly, the dielectric layer 116 may include a stack of a high-k material and a high bandgap material having a higher bandgap than a high-k material. In some embodiments, the dielectric layer 116 may include silicon oxide $SiO_2$ as a high bandgap material instead of aluminum oxide. The dielectric layer 116 including a high bandgap material may suppress leakage current. A high bandgap material may be ultra-thin. The high bandgap material may be thinner than a high-k material.

In embodiments of the present invention, the dielectric layer 116 may include a laminate structure in which the high-k material and the high bandgap material are alternately stacked. For example, the laminate structure may include a ZAZA ($ZrO_2$/$Al_2O_3$/$ZrO_2$/$Al_2O_3$), ZAZAZ ($ZrO_2$/$Al_2O_3$/$ZrO_2$/$Al_2O_3$/$ZrO_2$), HAHA ($HfO_2$/$Al_2O_3$/$HfO_2$/$Al_2O_3$) or HAHAH ($HfO_2$/$Al_2O_3$/$HfO_2$/$Al_2O_3$/$HfO_2$) structure. In the laminate structure, aluminum oxide ($Al_2O_3$) may be ultra-thin. In other embodiments of the present invention, the dielectric layer 116 may include a structure of a first high-k material doped with a second high-k material. For example, some embodiments may include titanium oxide ($TiO_2$)-doped zirconium oxide ($TiO_2$-doped $ZrO_2$). Yet in other embodiments of the invention, the dielectric layer 116 may include an intermixing structure of different high-k materials. For example, some embodiments may include TiZrAlO in which zirconium oxide, titanium oxide, and aluminum oxide are intermixed.

The upper electrode 119 may include a silicon-containing material, a germanium-containing material, a metal-containing material or any combinations thereof. The upper electrode 119 may include a metal, a metal nitride, a metal carbide, a conductive metal oxide or any combinations thereof. The upper electrode 119 may include, for example, titanium (Ti), titanium nitride (TiN), tantalum nitride (TaN), titanium carbon nitride (TiCN), tantalum carbon nitride (TaCN), tungsten (W), tungsten nitride (WN), ruthenium (Ru), iridium (Ir), ruthenium oxide ($RuO_2$), iridium oxide ($IrO_2$) or any combinations thereof. The upper electrode 119 may include a silicon (Si) layer, a germanium (Ge) layer, a silicon germanium (SiGe) layer or any combinations thereof. The upper electrode 119 may have a multilayer structure (Si/SiGe) formed by stacking the silicon germanium layer on the silicon layer. The upper electrode 119 may have a multilayer structure (Ge/SiGe) formed by stacking the silicon germanium layer on the germanium layer. The upper electrode 119 may include a stack structure of the silicon-containing material and the metal-containing material. The upper electrode 119 may be formed by stacking the silicon germanium layer and the metal nitride. The upper electrode 119 may have a multilayer structure (TiN/SiGe/WN) formed by stacking the silicon germanium layer and the tungsten nitride on the titanium nitride.

A cell metal line 124 may be disposed over the capacitor in the first region R1. The cell metal line 124 may be disposed at a higher level than the upper surface of the capacitor. A second insulation layer 121 may be disposed between the cell metal line 124 and the capacitor.

The cell metal line 124 may connect to the capacitor through a cell metal line contact 122. The cell metal line contact 122 may pass through the second insulation layer 121. One end of the cell metal line contact 122 may contact the upper electrode 119 and the other end of the cell metal line contact 122 may contact the cell metal line 124.

The discharge structure PS for discharging electrons induced by a plasma process may be disposed on the second region R2 of the substrate 101. The discharge structure PS may include the first diode D1, the first discharge contact plug 106', the second discharge contact plug 108', the first electrode 114', and the second electrode 119' stacked in a vertical direction from the substrate.

The first diode D1 may be defined by a junction region 104' and the substrate 101. The junction region 104' and the source/drain region 104 in the first region R1 may be formed at the same time.

The first discharge contact plug 106' and the second discharge contact plug 108' may be disposed on the second region R2 of the substrate 101 with the first discharge contact plug 106' contacting the junction region 104' of the first diode D1. The first discharge contact plug 106' and the second discharge contact plug 108' may be located at the same level with the first contact plug 106 and the second contact plug 108 in the first region R1, respectively. The first discharge contact plug 106' and the second discharge contact plug 108' may be formed at the same time with the first contact plug 106 and the second contact plug 108. The first discharge contact plug 106' and the second discharge contact plug 108' may be formed of the same material of the first and second contact plugs 106 and 108, respectively. The first discharge contact plug 106' may include a semiconductor material. The second discharge contact plug 108' may include a metal.

The first electrode 114' of the discharge structure PS may be located at the same level with the first lower electrode 114 of the capacitor. The first electrode 114' and the first lower electrode 114 may be formed at the same time. The first electrode 114' and the first lower electrode 114 may be made of the same material.

The second electrode 119' of the discharge structure PS may be located at the same level with the upper electrode 119 of the capacitor. The second electrode 119' and the upper electrode 119 may be formed at the same time. The second electrode 119' and the upper electrode 119 may be made of the same material. The second electrode 119' and the upper electrode 119 of the capacitor may be formed as a continuous single unit. In other word, the second electrode 119' can be electrically connected to the upper electrode 119 of the capacitor.

In accordance with embodiments of the present invention, the discharge structure PS may discharge, to the substrate, a plasma-induced charge by contacting the upper electrode 119 of the capacitor and forming an electrically connected current path through the first diode D1 of the second region R2. In other words, embodiments of the present invention can prevent the degradation of the performance of the dielectric layer 116 of the capacitor from plasma induced damage (PID) by discharging, to a substrate, a charge induced from a plasma process of forming the upper electrode 119, the cell metal line contact 122, and/or the cell metal line 124.

The third region R3 of the substrate 101 may include the peripheral gate PG, the first peripheral metal line 109, and the second peripheral metal line 125. The first peripheral metal line 109 and the second peripheral metal line 125 may contact the third region R3 of the substrate 101 through a first peripheral metal line contact 107 and a second peripheral metal line contact 123. The junction region 104" may be formed where the first peripheral metal line contact 107 contacts the substrate 101 in region R3.

The third region R3 of the substrate 101 may include the second diode D2. The second diode D2 may be electrically connected to the discharge structure PS in the second region R2. The second diode D2 may discharge, to the third region R3 of the substrate 101, a charge induced from a plasma process. The second diode D2 may contact the discharge structure PS through the third discharge contact plug 107'. The second discharge contact plug 108' may be extended to contact the first discharge contact plug 106' in the second region R2 and the third discharge contact plug 107' in the third region R3.

Embodiments of the present invention illustrate the discharge structure PS including the first electrode 114' of a cylinder-shape. However, the invention is not limited thereto. In other embodiments, the first electrode 114' of the discharge structure PS may be formed in various structures based on a structure of the lower electrode SN of the capacitor in the first region R1. In other embodiments, the first electrode 114' of the discharge structure PS may be of a pillar-shape. In other embodiments, the first electrode 114' of the discharge structure PS may further include a supporter covering an outer wall of the first electrode 114'.

FIGS. 2A to 2K are cross-sectional views illustrating a method for fabricating the semiconductor shown in FIG. 1 in accordance with an embodiment of the present invention. The components illustrated in FIGS. 2A to 2K and indicated by the same reference numerals as in FIGS. 2A to 2K may be those of the reference numerals as described with reference to FIG. 1.

Figure 2A:
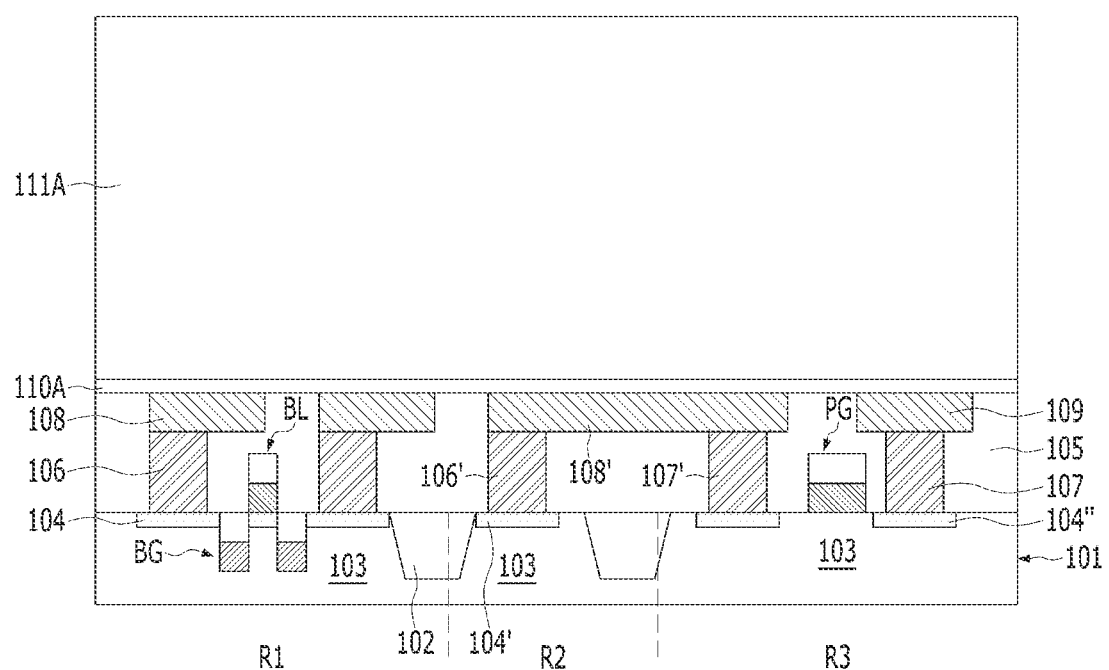
FIGS. 2A to 2K are cross-sectional views illustrating a method for fabricating the semiconductor device shown in FIG. 1 in accordance with an embodiment of the present invention.

Referring to FIG. 2A, the substrate 101, including the first region R1, the second region R2, and the third region R3, may be provided. The first region R1, the second region R2, and the third region R3 may be divided by the isolation layer 102. Each of the regions R1 to R3 may include an active region 103 that is defined by the isolation layer 102.

Subsequently, the gate structure BG may be formed on the first region R1 of the substrate 101. The gate structure BG may be of a buried gate structure located at a lower level than an upper surface of the substrate 101 in accordance with FIG. 1. However, the present invention is not limited thereto.

Subsequently, the source/drain region 104 may be formed in the substrate 101 on both sides of the gate structures BG through an ion-implantation process. The junction regions 104' and 104" may be formed in the second and third regions R2 and R3 of the substrate 101. The ion-implantation respectively for the source/drain region 104 and the junction regions 104' and 104" may be processed at the same time or may be processed separately through open masks that open the respective regions 104, 104' and 104".

Subsequently, the bit line structure BL may be formed on the gate structure BG. The bit line structure BL may be formed to contact the source/drain region 104 located between the gate structures BG. The peripheral gate PG may be formed on the third region R3 of the substrate 101. The peripheral gate PG and the bit line structure BL may be formed at the same or a different time.

Subsequently, the first insulation layer 105 may be formed over the first to third regions R1, R2, and R3 of the substrate 101.

Subsequently, the first and second contact plugs 106 and 108, the first to third discharge contact plugs 106', 108', and 107', the first peripheral metal line contact 107, and the first peripheral metal line 109 may be formed to pass through the first insulation layer 105 and contact the respective regions R1 to R3 of the substrate 101.

The embodiments of the present invention illustrate as an example that the first insulation layer 105 may be a single layer and contact plugs may be passing through the respective regions R1 to R3 of the first insulation layer 105. However, the first insulation layer 105 may include a multilayer of insulation materials.

For example, the first insulation layer 105 may be formed to include a first layer containing the first contact plug 106, the first discharge contact plug 106', the third discharge contact plug 107', and the first peripheral metal line contact 107 and a second layer containing the second discharge contact plug 108' and the first peripheral metal line 109.

First, a first layer may be formed on the substrate 101 and an opening passing through the first layer may be formed. The first contact plug 106, the first discharge contact plug 106', the third discharge contact plug 107', and the first peripheral metal line contact 107 may be formed by filling a semiconductor material into the opening. Subsequently, a second layer may be formed on the first layer. An opening passing through the second layer and exposing the first contact plug 106, the first and third discharge contact plug 106' and 107', and the first peripheral metal line contact 107 may be formed. The second contact plug 108, the second discharge contact plug 108', and the first peripheral metal line 109 may be formed by filling a metal into the opening.

The first contact plug 106, the first and third discharge contact plug 106' and 107', and the first peripheral metal line contact 107 may be located at the same level. The second contact plug 108, the second discharge contact plug 108', and the first peripheral metal line 109 may be located at the same level.

Subsequently, the etch stop layer 110A may be formed on the first insulation layer 105. The etch stop layer 110A may include an insulation material. The etch stop layer 110A and the first insulation layer 105 may include a material having different etch selectivity.

Subsequently, the sacrificial layer 111A may be formed on the etch stop layer 110A. The sacrificial layer 111A is for providing an opening for forming the lower electrode of a capacitor. A thickness of the sacrificial layer 111A may be adjusted to be at least the same as the height of the lower electrode of the capacitor. The sacrificial layer 111A may include an easily removable material. The sacrificial layer 111A may include a material having an etch selectivity with respect to the etch stop layer 110A. The sacrificial layer 111A may be formed through a deposition process such as chemical vaporization deposition (CVD), physical vaporization deposition (PVD) and so forth. The sacrificial layer 111A may include an insulating material. For example, the sacrificial layer 111A may include a silicon oxide.

Figure 2B:
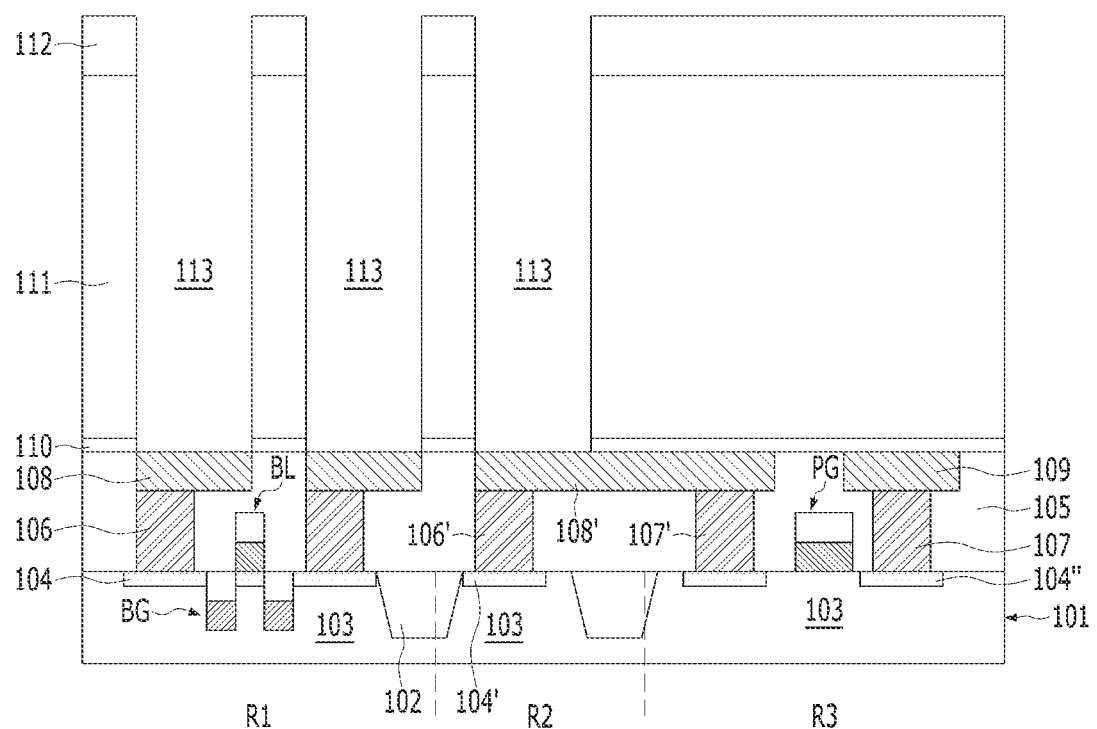

Referring to FIG. 2B, a first mask pattern 112 may be formed on the sacrificial layer 111A. A sacrificial pattern 111 and an etch stop pattern 110 may be formed based on the first mask pattern 112. The sacrificial pattern 111 and the etch stop pattern 110 may define a lower electrode opening 113 in the first region R1 and the second region R2. The lower electrode opening 113 may expose the second contact plug 108 of the first region R1 and the second discharge contact plug 108' of the second region R2 by passing through the sacrificial pattern 111 and the etch stop pattern 110. The lower electrode opening 113 may have a high aspect ratio. The lower electrode opening 113 may have, at minimum, a high aspect ratio of 1:1 or more. For example, the lower electrode opening 113 may have a high aspect ratio of 1:10 or more. Aspect ratio as used herein refers to the ratio of width to height.

Subsequently, the first mask pattern 112 may be removed. The first mask pattern including a photosensitive material may be removed by a strip process.

Figure 2C:
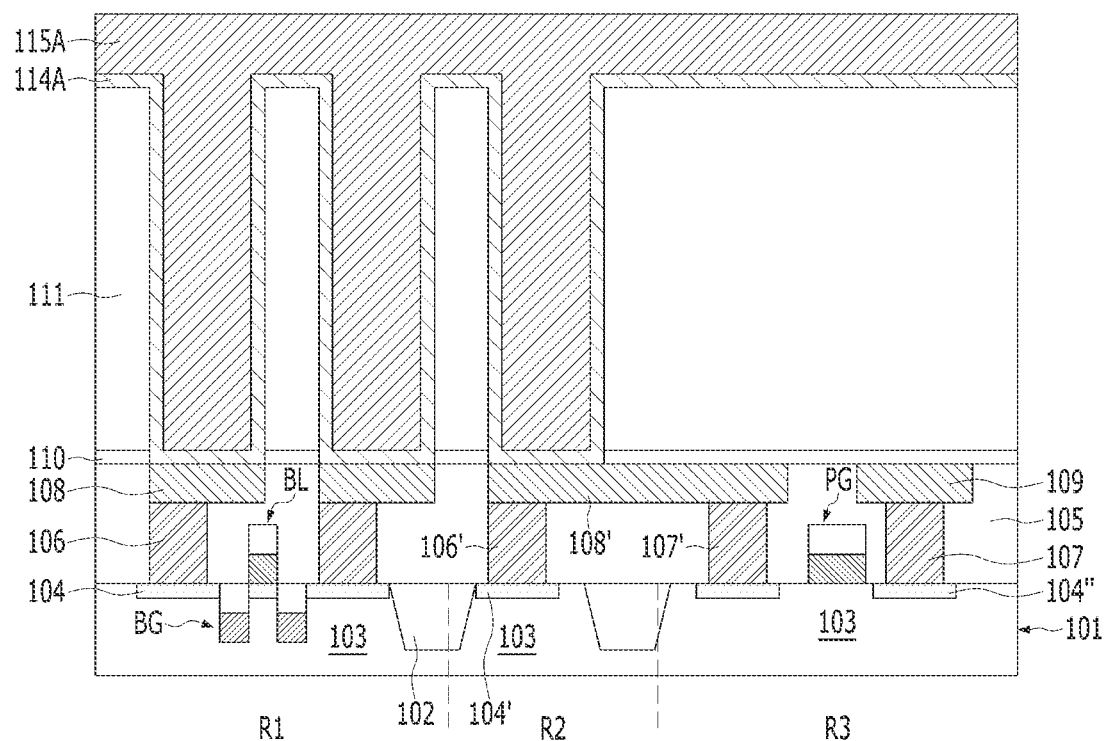

Referring to FIG. 2C, a first lower electrode material layer 114A and a second lower electrode material layer 115A may be sequentially formed along the lower electrode opening 113.

The first lower electrode material layer 114A and the second lower electrode material layer 115A may include polysilicon, a metal, a metal nitride, a conductive metal oxide, a metal silicide, a noble metal, or a combination thereof. The first lower electrode material layer 114A and the second lower electrode material layer 115A may include, for example, at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt), or a combination thereof.

In embodiments of the present invention, the first lower electrode material layer 114A may include a metal. The first lower electrode material layer 114A may include a material having a good step coverage. For example, the first lower electrode material layer 114A may include titanium nitride (TiN).

The second lower electrode material layer 115A may be formed on the first lower electrode material layer 114A to fill the lower electrode opening 113. The second lower electrode material layer 115A may include a semiconductor material. The second lower electrode material layer 115A may include a material having an etch selectivity with respect to the first lower electrode material layer 114A. The second lower electrode material layer 115A may include a material having a good gap-fill characteristic. For example, the second lower electrode material layer 115A may include doped polysilicon.

In another embodiment of the present invention, the first lower electrode material layer 114A and the second lower electrode material layer 115A may all include titanium nitride (TiN). The first lower electrode material layer 114A and the second lower electrode material layer 115A may include titanium nitride (ALD-TiN) formed through an atomic layer deposition (ALD) process. In another embodiment, the first lower electrode material layer 114A and the second lower electrode material layer 115A may include a stacked structure of titanium nitride (TiN) and tungsten (W). In another embodiment, the first lower electrode 114 and the second lower electrode 115 may have a single layer structure having the same material.

Figure 2D:
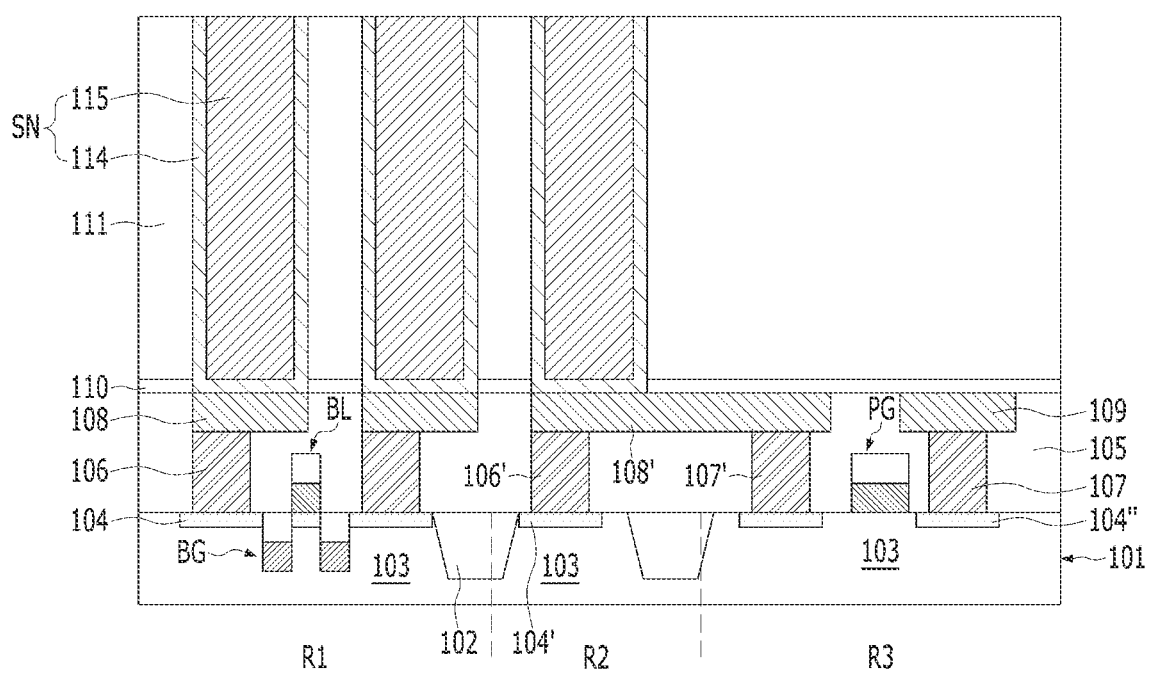
Figure 2E:
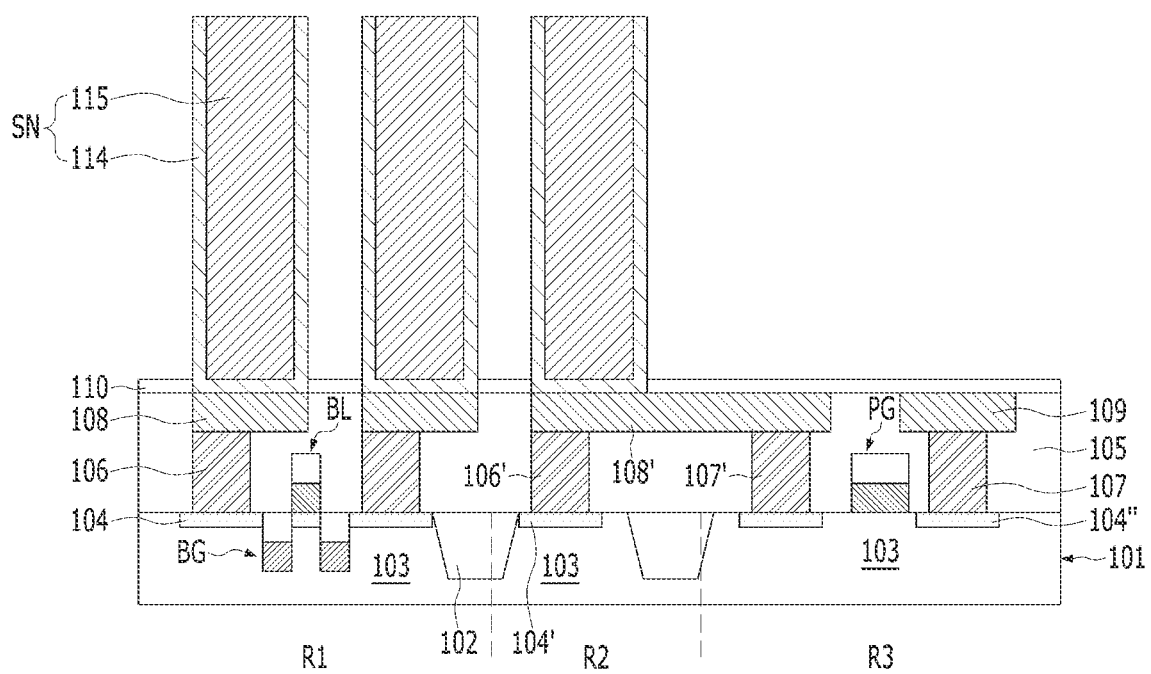

Referring to FIGS. 2D to 2E, the lower electrode SN may have a pillar structure. A separation process of the lower electrode SN may be processed to form the lower electrode SN. The separation process of the lower electrode may include an etch back process and/or a CMP process. The lower electrode SN of a pillar structure may be formed of the first lower electrode 114 of a cylinder structure and the second lower electrode 115 of a pillar structure having a contact with the first lower electrode 114. The separation process may be performed targeting an exposed upper surface of the sacrificial pattern 111. In other words, an upper surface of the lower electrode SN and the upper surface of the sacrificial pattern 111 may be at the same level.

Subsequently, the sacrificial pattern 111 may be removed. The sacrificial pattern 111 may be removed by a dip-out process. The dip-out process may use one or more wet chemicals among HF, $NH_4F/NH_4OH$, $H_2O_3$, HCl, $HNO_3$, $H_2SO_4$.

Figure 2F:
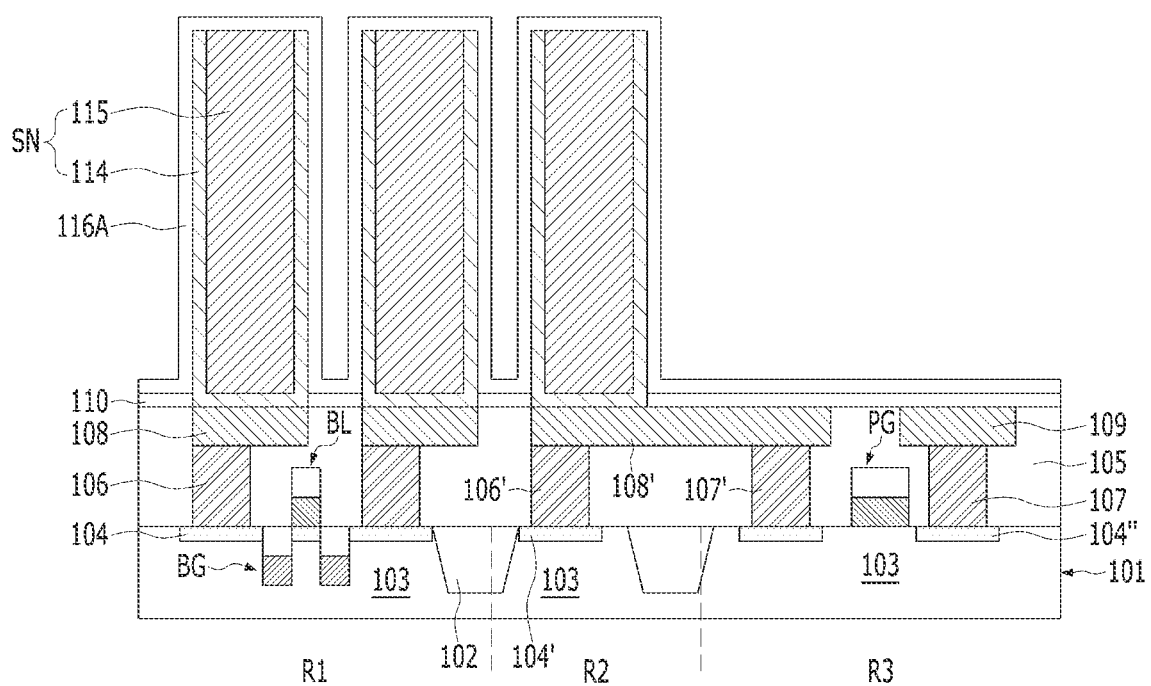

Referring to FIG. 2F, a dielectric material layer 116A may be formed along a whole surface area of the lower electrode SN. The dielectric material layer 116A may be formed through a chemical vaporization deposition (CVP) process or an atomic layer deposition (ALD) process with a good step coverage. The dielectric material layer 116A may include an insulating material. The dielectric material layer 116A may include a high-k material whose dielectric constant is higher than the dielectric constant of a silicon oxide ($SiO_2$). The high-K materials may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$), or a strontium titanium oxide ($SrTiO_3$). According to another embodiment of the present invention, the dielectric layer 116A may be a composite layer including two or more layers of the listed high-K materials. According to an embodiment of the present invention, the dielectric layer 116A may be formed of a zirconium oxide-based material having fine leakage current characteristics while sufficiently reducing an equivalent oxide layer thickness (EOT). For example, in the embodiment, the dielectric layer 116A may include a ZAZ ($ZrO_2/Al_2O_3/ZrO_2$). According to another embodiment of the present invention, the dielectric layer 116A may include a HAH ($HfO_2/Al_2O_3/HfO_2$). According to yet another embodiment of the present invention, the dielectric layer 116A may include TZAZ($TiO_2/ZrO_2/Al_2O_3/ZrO_2$), TZAZT($TiO_2/ZrO_2/Al_2O_3/ZrO_2/TiO_2$), ZAZT($ZrO_2/Al_2O_3/ZrO_2/TiO_2$), TZ($TiO_2/ZrO_2$), or ZAZAT ($ZrO_2/Al_2O_3/ZrO_2/Al_2O_3/TiO_2$). $TiO_2$ may be replaced with $Ta_2O_5$ among the dielectric layer stack of TZAZ, TZAZT, ZAZT, TZ, ZAZAT.

Figure 2G:
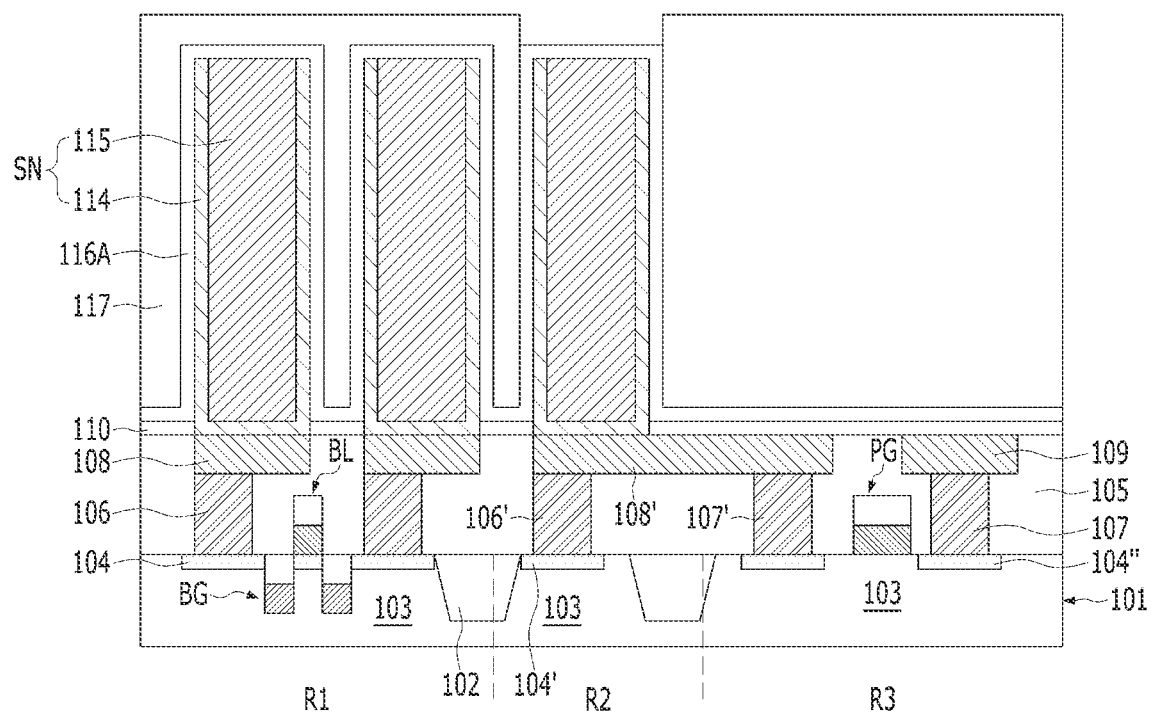

Referring to FIG. 2G, a second mask pattern 117 may be formed over the substrate 101 containing the dielectric material layer 116A. The second mask pattern 117 may include an easily removable material. The second mask pattern 117 may include a material having an etch selectivity different from that of the dielectric material layer 116A or the lower electrode SN. The second mask pattern 117 may include an opening which selectively exposes the dielectric material layer 116A formed on the upper surface of the lower electrode SN.

Figure 2H:
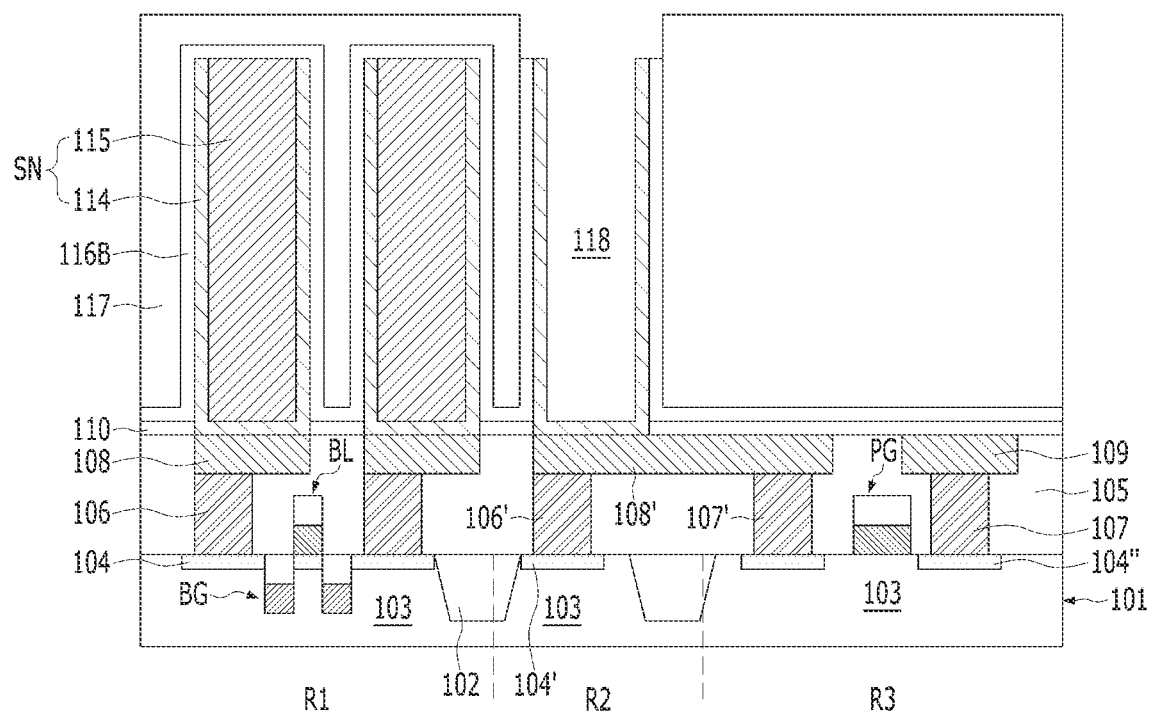

Referring to FIG. 2H, the dielectric material layer 116A (refer to FIG. 2G) and the second lower electrode 115 (refer to FIG. 2G) in the second region R2 exposed by the second mask pattern 117 may be etched. The second lower electrode 115 in the second region R2 may be totally removed and the first lower electrode 114 may remain alone. Thus, the opening 118 may be formed between the first lower electrode 114 in the second region R2. The etched dielectric material layer is indicated by reference numeral 116B.

Subsequently, the second mask pattern 117 may be removed. The second mask pattern 117 composed of silicon oxide may be removed by a web dip-out process. In another embodiment of the present invention, the second mask pattern 117 composed of a photo resist may be removed by a strip process.

Figure 2I:
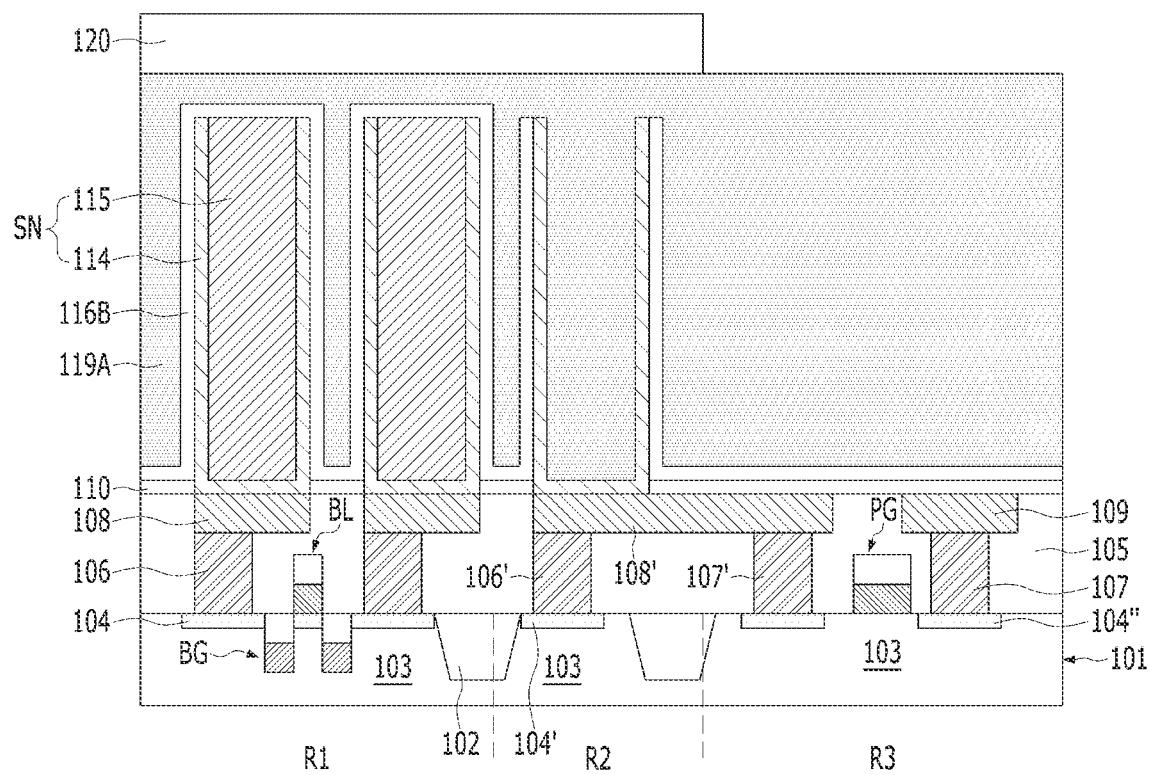

Referring to FIG. 2I, an upper electrode material layer 119A may be formed over the substrate 101 containing the dielectric material layer 116B. The upper electrode material layer 119A may include a metal-base material. For example, the upper electrode material layer 119A may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. The upper electrode material layer 119A may be formed through a Low-Pressure Chemical Vapor Deposition (LPCVD) process, a Plasma Enhanced Chemical Vapor Deposition (PECVD) process, or an Atomic Layer Deposition (ALD) process. According to an embodiment of the present invention, the upper electrode material layer 119A may include a titanium nitride (ALD-TiN) formed through the ALD process.

According to another embodiment of the present invention, an upper electrode material layer 119A may have a multi-layer structure. The upper electrode material layer 119A may be formed by sequentially stacking a first metal-containing material, a silicon germanium, and a second metal-containing material. The first metal-containing layer and the second metal-containing layer may include titanium (Ti), a titanium nitride (TiN), tantalum (Ta), a tantalum nitride (TaN), a titanium aluminum nitride (TiAlN), tungsten (W), a tungsten nitride (WN), ruthenium (Ru), a ruthenium oxide ($RuO_2$), iridium (Ir), an iridium oxide ($IrO_2$), platinum (Pt), or a combination thereof. For example, the first metal-containing material may include a titanium nitride, and the second metal-containing material may include WN/W where a tungsten nitride and tungsten are stacked. The silicon germanium layer may be doped with boron.

In accordance with an embodiment of the present invention, the upper electrode material layer 119A may include a gap-fill material or a low-resistance material. The gap-fill material may include a silicon germanium (SiGe). The low-resistance material may include a tungsten nitride (WN). The gap-fill material may fill the narrow gap between the lower electrodes SN without a void. The low-resistance material may lower the resistance of the upper electrode material layer 119A.

Subsequently, a third mask pattern 120 may be formed over the upper electrode material layer 119A. The third mask pattern 120 may be patterned so that the third region R3 is to be open.

Figure 2J:
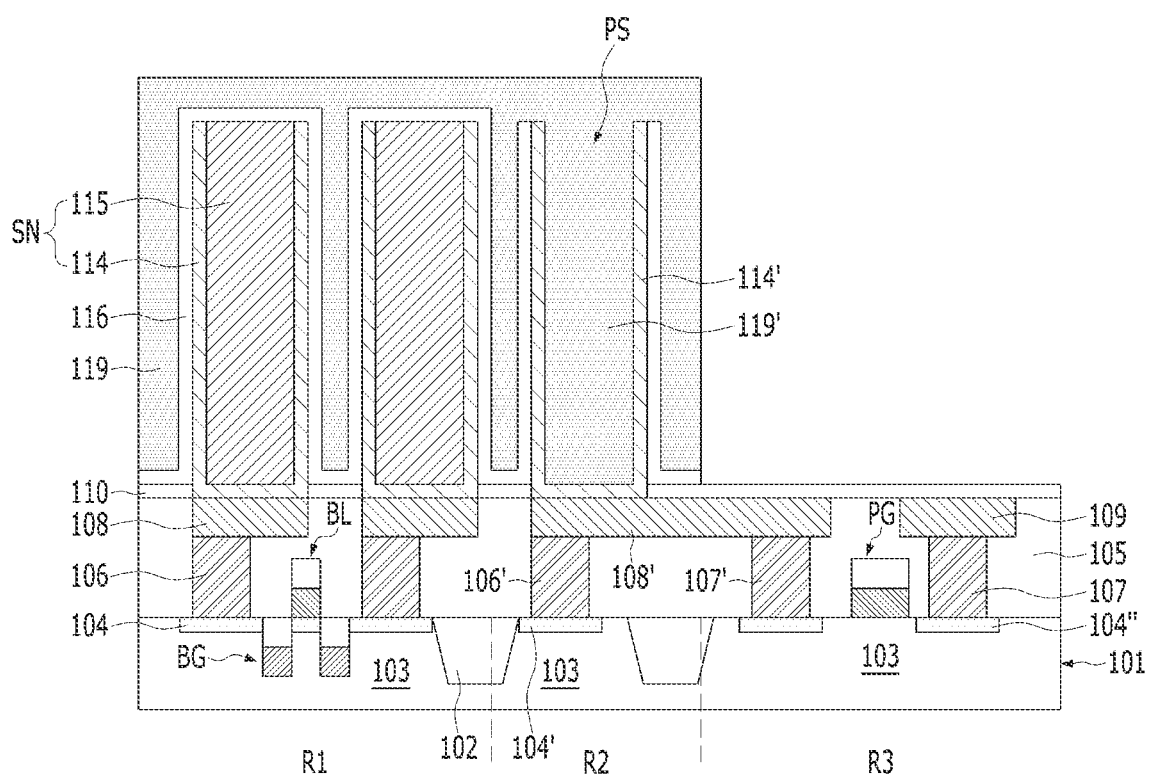

Referring to FIG. 2J, the third mask pattern 120 (refer to FIG. 2I) may be used to etch the upper electrode material layer 119A and the dielectric material layer 116B.

Thus, the first region R1 may include a capacitor where the lower electrode SN, the dielectric layer 116, and the upper electrode 119 are sequentially stacked. The second region R2 may include a discharge structure PS where the first electrode 114' and the second electrode 119' are stacked. The first electrode 114' and the first lower electrode 114 may be formed at the same time, of the same material, in the same structure, at the same level. The second electrode 119' may contact the upper electrode 119 in the first region R1.

Figure 2K:
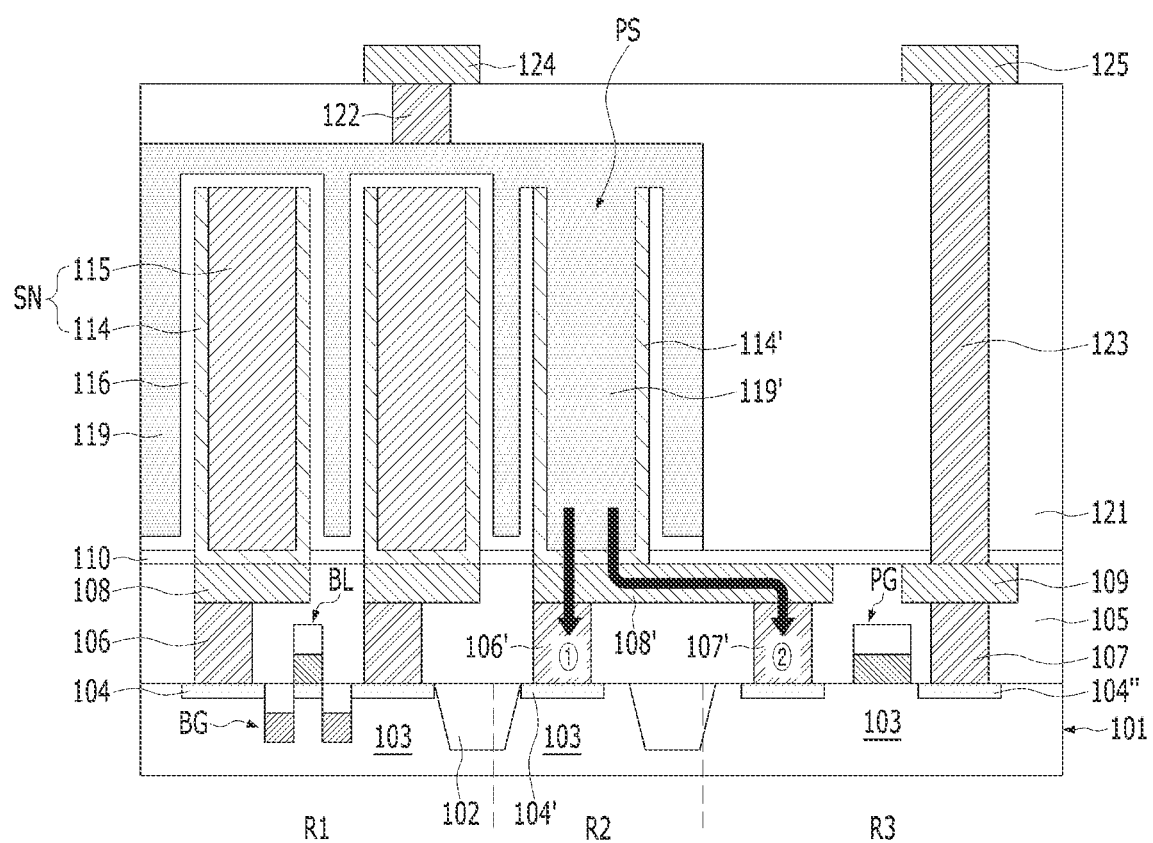

Referring to FIG. 2K, a second insulating layer 121 may be formed over the substrate 101 including the upper electrode 119 of the capacitor. The second insulating layer 121 may include a single layer or multi-layer structure.

Subsequently, the cell metal line contact 122 may be formed in the first region R1. The cell metal line contact 122 may contact the upper electrode 119 of the capacitor by passing through the second insulating layer 121. A second peripheral metal line contact 123 may be formed in the third region R3. The second peripheral metal line contact 123 may contact the first peripheral metal line 109 by passing through the second insulating layer 121 and the etch stop pattern 110.

Subsequently, the cell metal line 124 may be formed over the second insulating layer 121 in the first region R1. The cell metal line 124 may contact the cell metal line contact 122. The second peripheral metal line 125 may be formed over the second insulating layer 121 in the third region R3 and may contact the second peripheral metal line contact 123.

The cell metal line 124 and the second peripheral metal line 125 may be made of the same material and located at the same level.

In accordance with embodiments of the present invention, the discharge structure PS may discharge charges induced by the plasma process to the substrate by contacting the upper electrode 119 of the capacitor and forming an electrically connected current path through the first diode D1 of the second region R2 and the second diode D2 of the third region R3. In other words, the discharge structure PS in accordance with the embodiments of the present invention can prevent the degradation of the performance of the dielectric layer from plasma induced damage (PID) resulting from plasma etching processes of forming the upper electrode 119, the cell metal line contact 122, the cell metal line 124, and so forth.

In accordance with an embodiment of the present invention, the discharge structure PS is formed to be in contact with the upper electrode 119 of the capacitor in the first region R1. However, the present invention is not limited thereto. In another embodiment of the present invention, the discharge structure PS may be formed to be in contact with an upper electrode of a reservoir capacitor of a peripheral circuit region.

In accordance with an embodiment of the present invention, a single discharge structure PS exists. In other embodiments, there may be multiple discharge structures PS. The multiple discharge structures PS may discharge, to the substrate 101, a charge through the first discharge contact plug 106', the second discharge contact plug 108', and the third discharge contact plug 107'.

In accordance with an embodiment of the present invention, the discharge structure PS includes the first electrode 114' of a cylinder-shape. However, the present invention is not limited thereto. In other embodiments, the first electrode 114' of the discharge structure PS may be formed in various structures depending on the structure of the lower electrode SN of a capacitor in the first region R1. For example, the first electrode 114' of the discharge structure PS may be formed of a pillar-shape. In another embodiment, the first electrode 114' of the discharge structure PS may be formed of a pillar structure. In another embodiment of the present invention, the first electrode 114' of the discharge structure PS may further include a supporter covering an outer wall of the first electrode 114'.

FIGS. 3A to 3D are cross-sectional views illustrating another embodiment of a method for fabricating a semiconductor device in accordance with an embodiment of the present invention. FIGS. 3A to 3D are cross-sectional views illustrating another embodiment of a method for fabricating a semiconductor device following the fabrication process described with reference to FIGS. 2A to 2G. The components illustrated in FIG. 3A and indicated by the same reference numerals as in FIGS. 2A to 2G may be those of the reference numerals and may be formed through the same process as described with reference to FIGS. 2A to 2G.

Figure 3A:
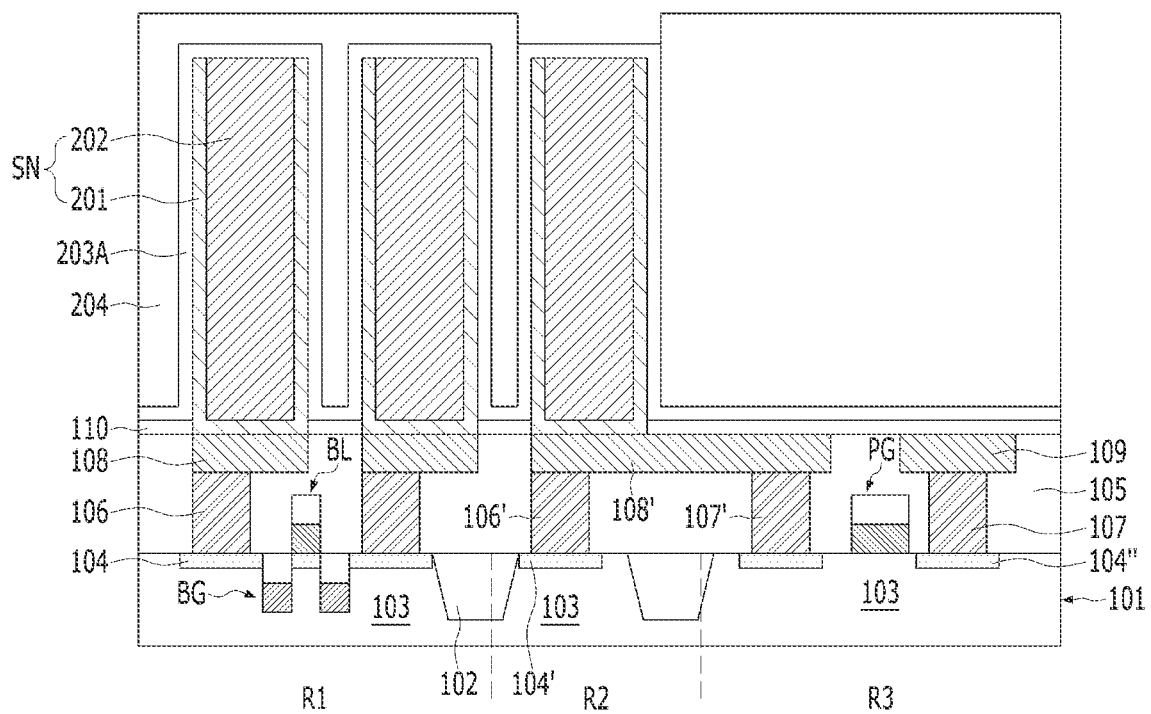
FIGS. 3A to 3D, 4A to 4D, 5A to 5D, and 6A to 6D are cross-sectional views illustrating methods for fabricating semiconductor devices according to other embodiments of the present invention.

Referring to FIG. 3A, the reference numeral 201 may refer to the first lower electrode. The reference numeral 202 may refer to the second lower electrode. The reference numeral 203A may refer to the dielectric material layer. The reference numeral 204 may refer to the second mask pattern.

The second mask pattern 204 may include an easily removable material. The second mask pattern 204 may include a material having different etch selectivity from the dielectric material layer 203A and the lower electrode SN. The second mask pattern 204 may include an opening that selectively exposes the dielectric material layer 203A formed over the lower electrode SN in the second region R2.

Figure 3B:
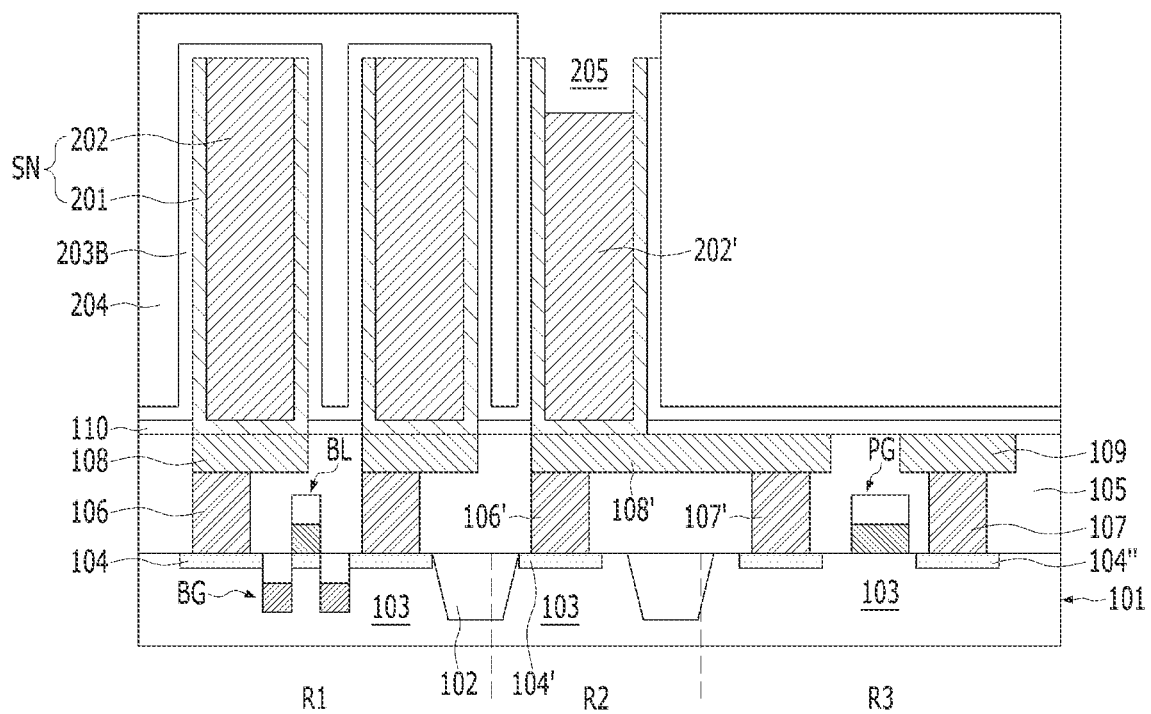

Referring to FIG. 3B, the dielectric material layer 203A (refer to FIG. 3A) and the second lower electrode 202 (refer to FIG. 3A) in the second region R2 exposed by the second mask pattern 204 may be etched. The second lower electrode 202 of the second region R2 may be partially removed. The second lower electrode 202 may be recessed and denoted as 202'. A trench 205 may be defined by the first lower electrode 201 and the second lower electrode 202' of the second region R2. An etched dielectric material layer is indicated by reference numeral 203B.

Subsequently, the second mask pattern 204 may be removed.

Figure 3C:
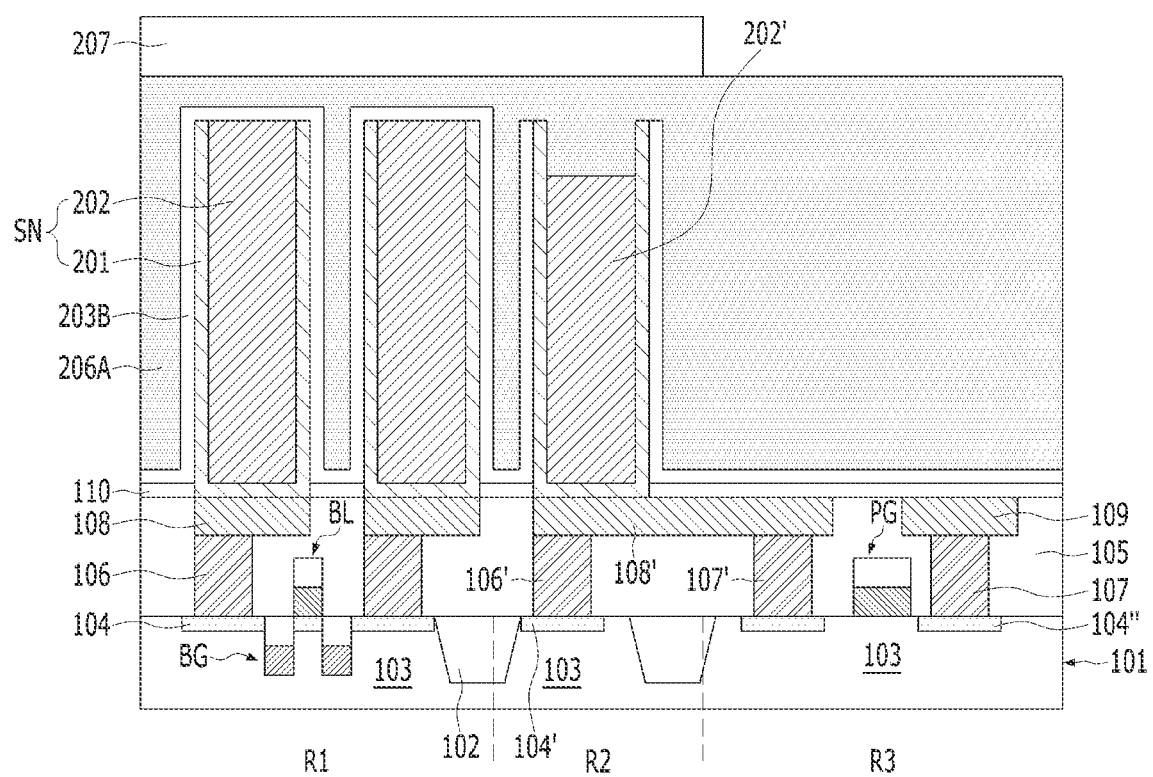

Referring to FIG. 3C, an upper electrode material layer 206A may be formed over the substrate 101 containing the dielectric material layer 203B.

Subsequently, a third mask pattern 207 may be formed over the upper electrode material layer 206A. The third mask pattern 207 may be patterned so that the third region R3 is to be open.

Figure 3D:
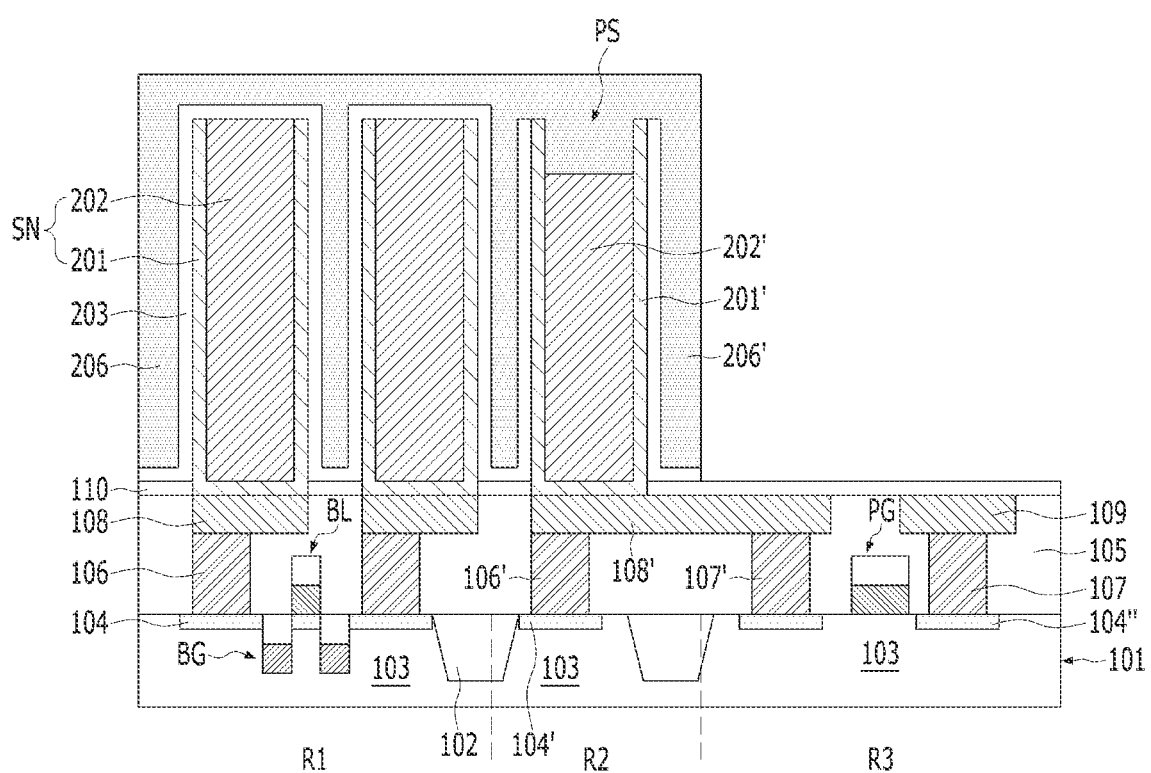

Referring to FIG. 3D, the upper electrode material layer 206A and the dielectric material layer 203B may be etched by using the third mask pattern 207 (refer to FIG. 3C).

Thus, the first region R1 may include a capacitor where the lower electrode SN, the dielectric layer 203, and the upper electrode 206 are sequentially stacked. The second region R2 may include the discharge structure PS where the first electrode 201', the second electrode 202', and the third electrode 206' are stacked. The first electrode 201' and the second electrode 202' may be formed at the same time, of the same material, in the same structure with the first lower electrode 201 and the second lower electrode 202. The third electrode 206' and the upper electrode 206 may be formed at the same time, of the same material, at the same level. The third electrode 206' may contact the upper electrode 206 in the first region R1.

FIGS. 4A to 4D are cross-sectional views illustrating another method for fabricating a semiconductor device in accordance with an embodiment of the present invention. FIGS. 4A to 4D illustrate a semiconductor device containing a capacitor having a different structure from the capacitor illustrated in FIG. 1. The components illustrated in FIGS. 4A to 4D and indicated by the same reference numerals as in FIG. 1 may be those of the reference numerals as described with reference to FIG. 1.

Figure 4A:
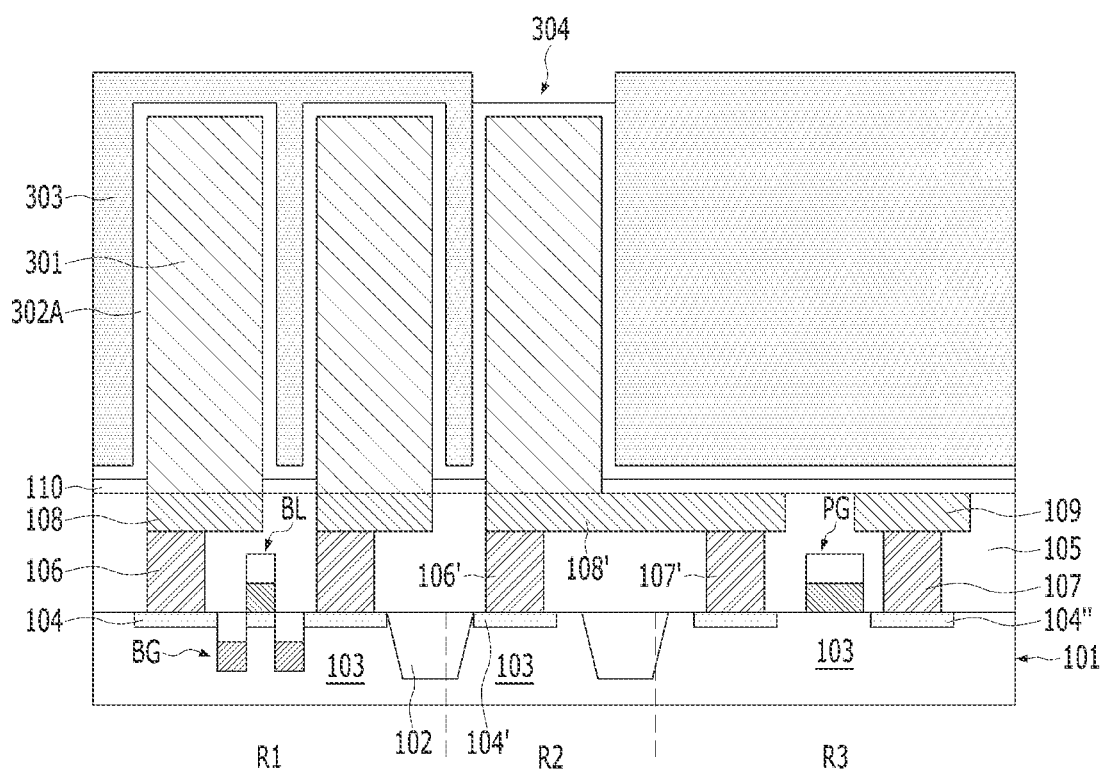

Referring to FIG. 4A, the reference numeral 301 may refer to the lower electrode of a pillar-shape composed of a single material. The reference numeral 302A may refer to the dielectric material layer. The reference numeral 303 may refer to the second mask pattern.

The second mask pattern 303 may include an easily removable material. The second mask pattern 303 may include a material having different etch selectivity from the dielectric material layer 302A and the lower electrode 301. The second mask pattern 303 may include an opening that selectively exposes the dielectric material layer 302A formed over the lower electrode 301 in the second region R2.

Figure 4B:
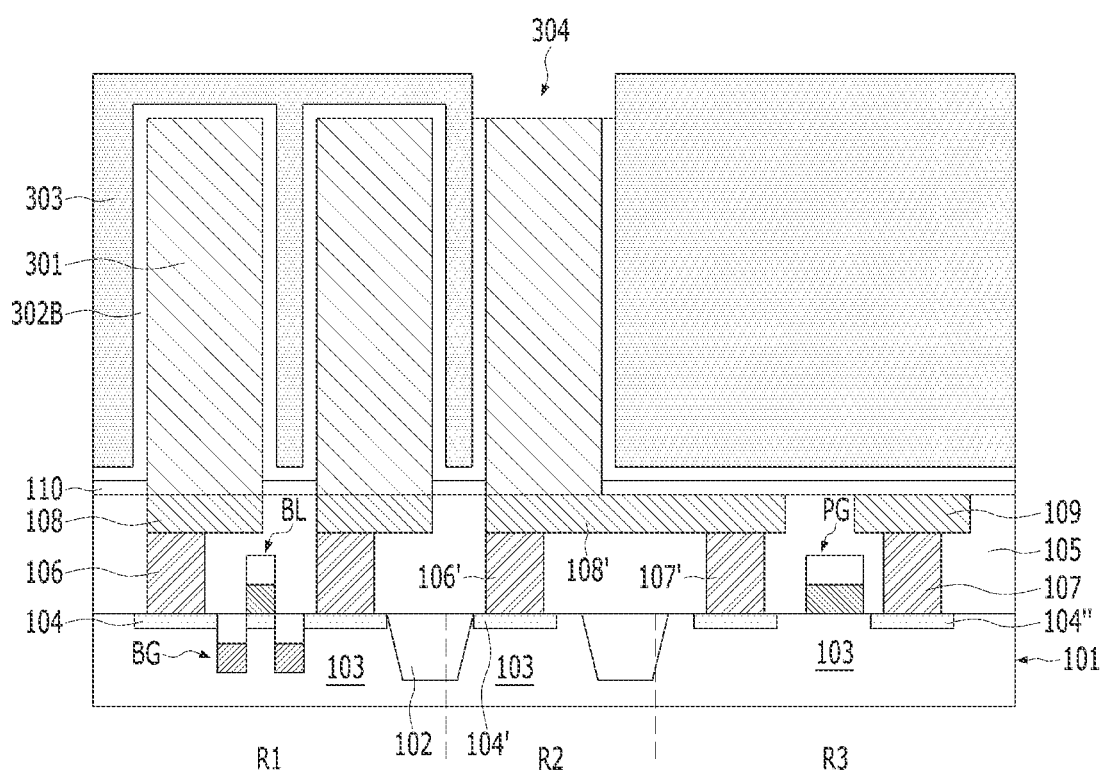

Referring to FIG. 4B, the dielectric material layer 302A (refer to FIG. 4A) in the second region R2 exposed by the second mask pattern 303 may be etched. Thus, an exposed top surface of the lower electrode 301 in the second region R2 may be defined as an opening 304. Etched dielectric material layer is denoted as 302B.

Subsequently, the second mask pattern 303 may be removed.

Figure 4C:
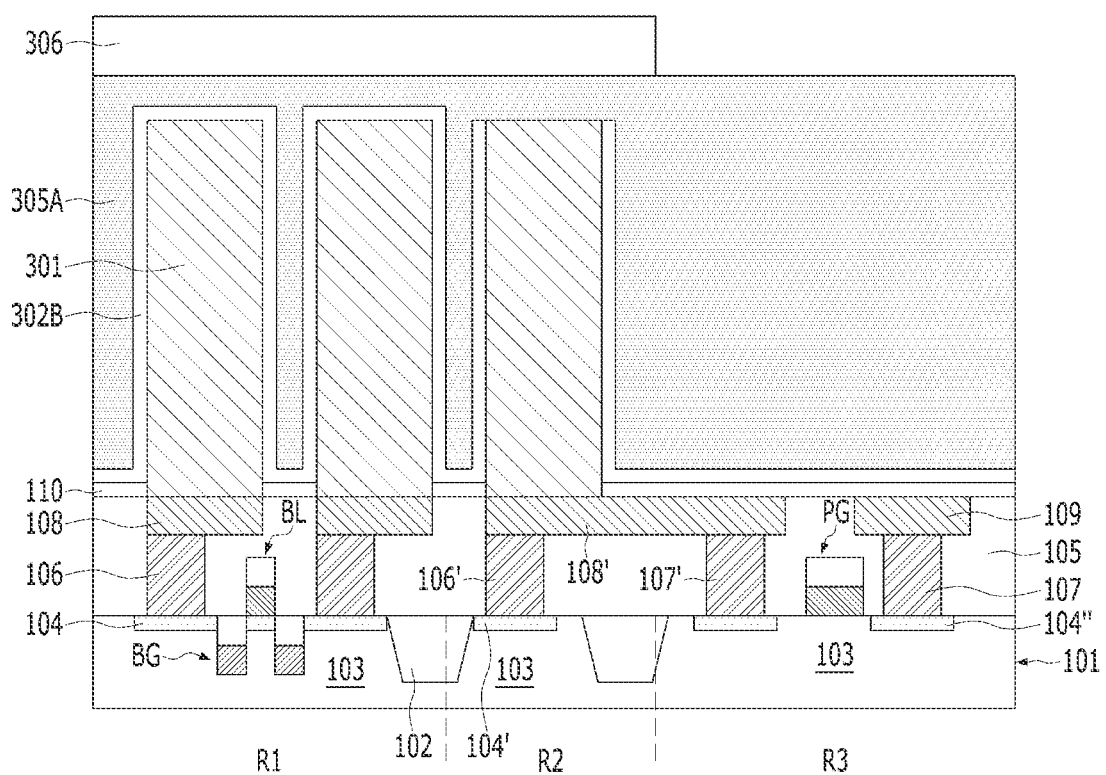

Referring to FIG. 4C, an upper electrode material layer 305A may be formed over the substrate 101 containing the dielectric material layer 302B.

Subsequently, a third mask pattern 306 may be formed over the upper electrode material layer 305A. The third mask pattern 306 may be patterned so that the third region R3 is to be open.

Figure 4D:
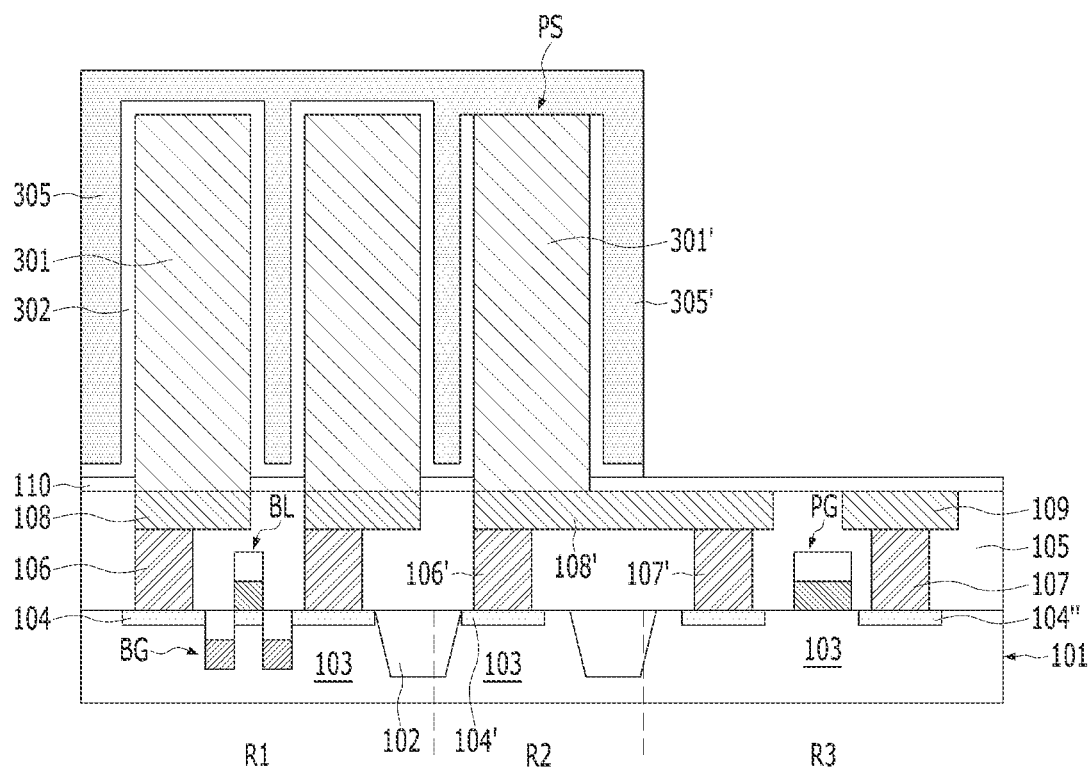

Referring to FIG. 4D, the third mask pattern 306 (refer to FIG. 4C) may be used to etch the upper electrode material layer 305A (refer to FIG. 4C) and the dielectric material layer 302B (refer to FIG. 4C).

Thus, the first region R1 may include a capacitor where the lower electrode 301, the dielectric layer 302, and the upper electrode 305 are stacked. The second region R2 may include the discharge structure PS where the first electrode 301' and the second electrode 305' are stacked. The first electrode 301' and the first lower electrode 301 may be formed at the same time, of the same material, and at the same level. The third electrode 305' may contact the upper electrode 305 in the first region R1.

FIGS. 5A to 5D are cross-sectional views illustrating another method for fabricating a semiconductor in accordance with an embodiment of the present invention. FIGS. 5A to 5D illustrate a semiconductor device containing a capacitor having a different structure from the capacitor illustrated in FIG. 1. The components illustrated in FIGS. 5A to 5D and indicated by the same reference numerals as in FIG. 1 may be those of the reference numerals as described with reference to FIG. 1.

Figure 5A:
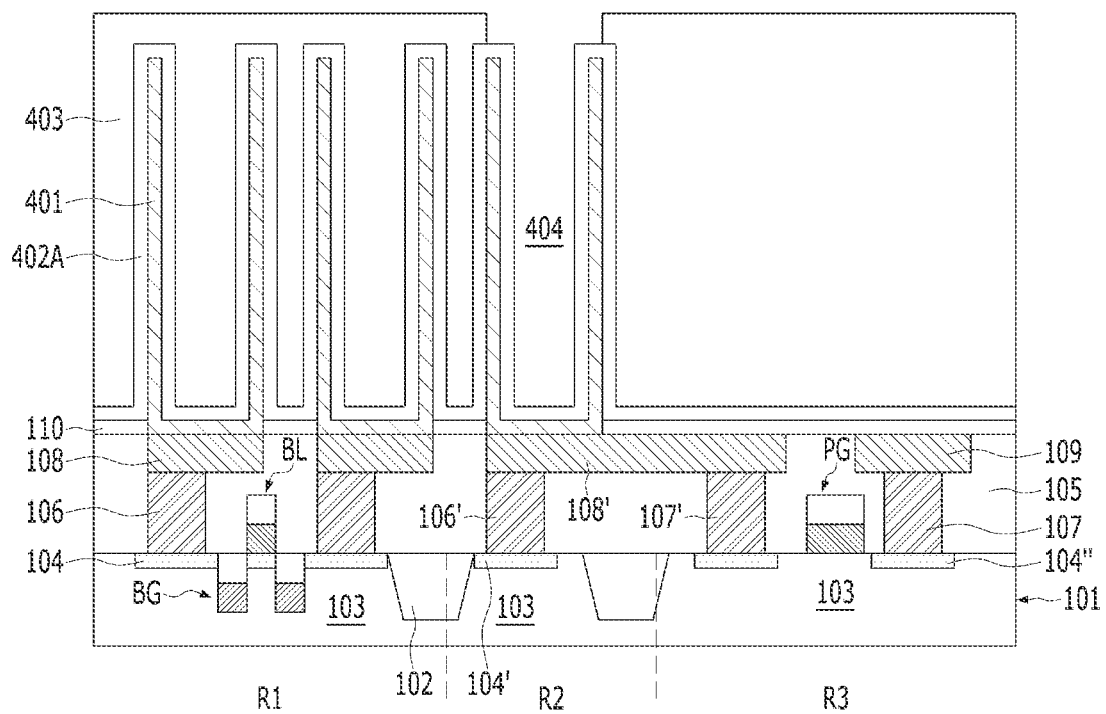

Referring to FIG. 5A, the reference numeral 401 may refer to the lower electrode of a cylinder-shape. The reference numeral 402A may refer to the dielectric material layer. The reference numeral 403 may refer to the second mask pattern.

The second mask pattern 403 may include an easily removable material. The second mask pattern 403 may include a material having different etch selectivity from the dielectric material layer 402A and the lower electrode 401. The second mask pattern 403 may include an opening 404 that selectively exposes the dielectric material layer 402A formed over the lower electrode 401 in the second region R2.

Figure 5B:
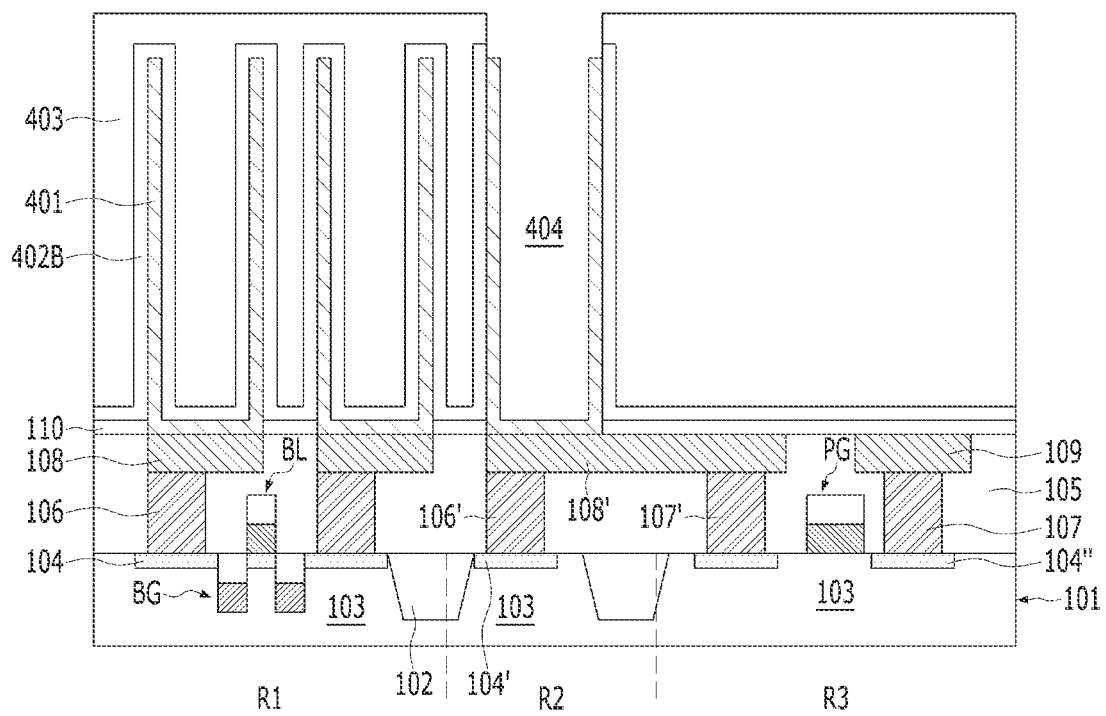

Referring to FIG. 5B, the dielectric material layer 402A (refer to FIG. 5A) in the second region R2 exposed by the second mask pattern 403 may be etched. Thus, an exposed top surface of the lower electrode 401 in the second region R2 may be defined as an opening 404. Etched dielectric material layer is denoted as 402B. In accordance with an embodiment of the present invention, the exposed portion of the dielectric material layer 402A (refer to FIG. 5A) is totally removed. However, the present invention is not limited thereto. The dielectric material layer 402A (refer to FIG. 5A) may be partially removed thus in exposing a sidewall or sidewalls of the lower electrode 401 or a bottom surface of the lower electrode 401. A whole or a partial portion of the lower electrode 401 may be exposed so that the lower electrode 401 may form a current path by being electrically connected to a subsequent upper electrode.

Subsequently, the second mask pattern 403 may be removed.

Figure 5C:
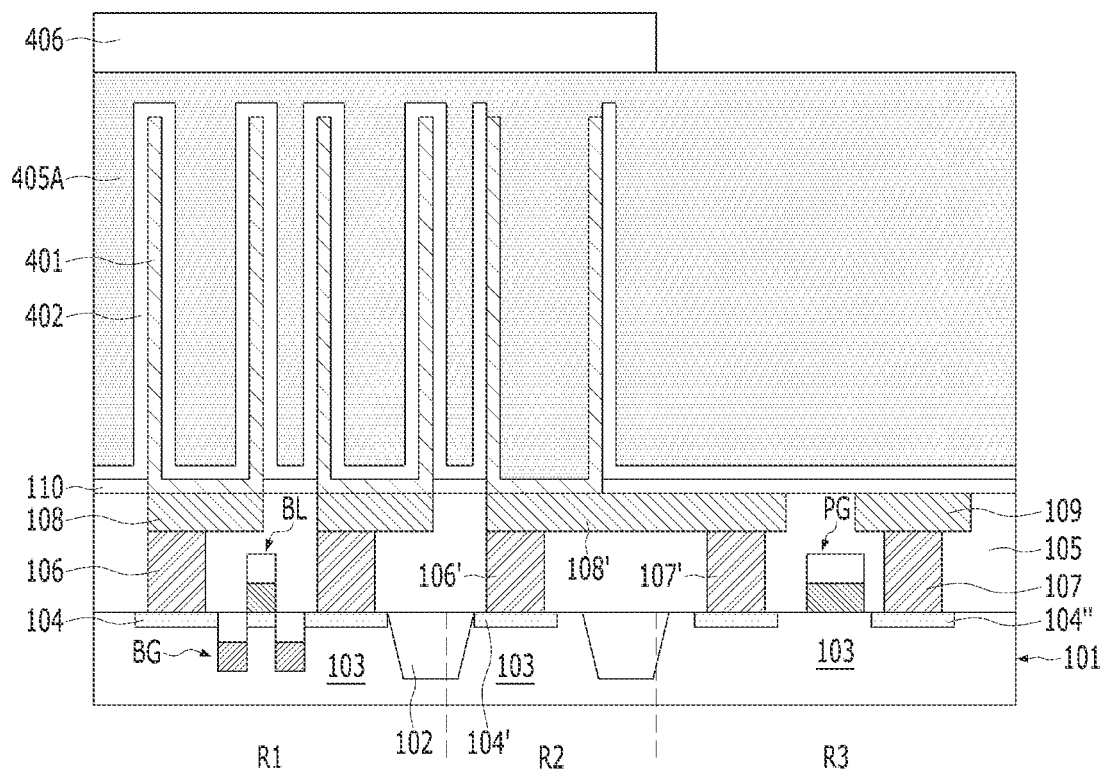

Referring to FIG. 5C, the upper electrode material layer 405A may be formed over the substrate 101 containing the dielectric material layer 402B.

Subsequently, a third mask pattern 406 may be formed over the upper electrode material layer 405A. The third mask pattern 406 may be patterned so that the third region R3 is to be open.

Figure 5D:
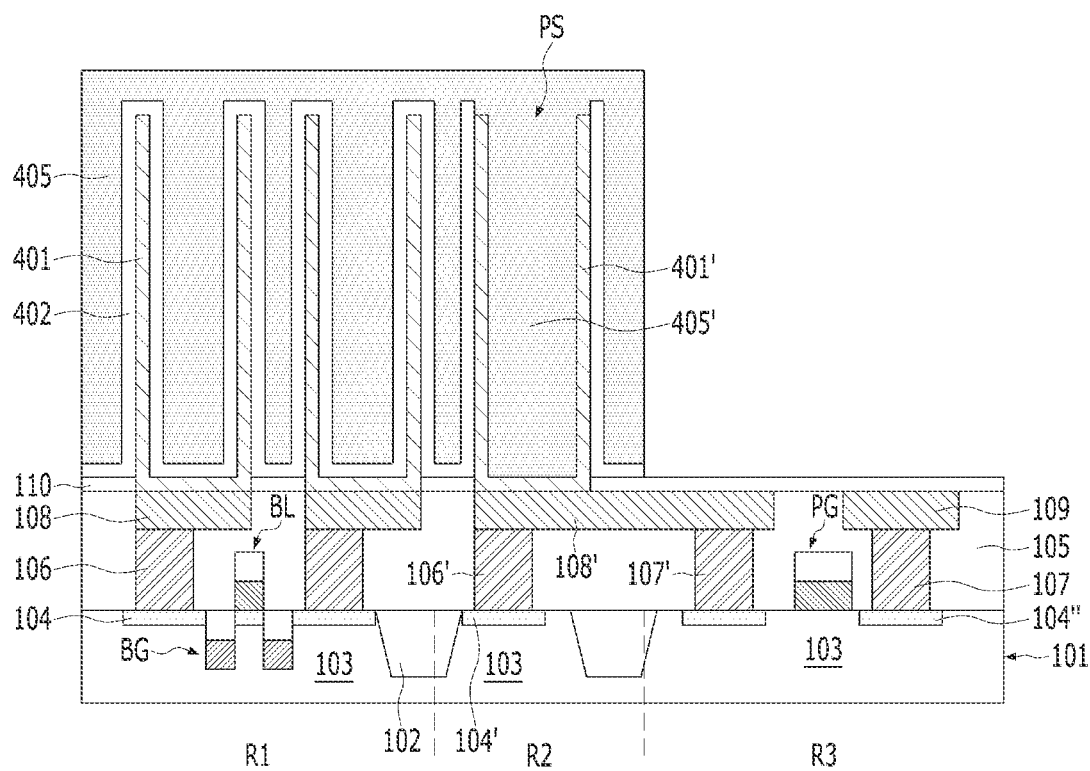

Referring to FIG. 5D, the third mask pattern 406 (refer to FIG. 5C) may be used to etch the upper electrode material layer 405A (refer to FIG. 5C) and the dielectric material layer 403B (refer to FIG. 5C).

Thus, the first region R1 may include a capacitor where the lower electrode 401, the dielectric layer 402, and the upper electrode 405 are stacked. The second region R2 may include a discharge structure PS where the first electrode 401' and the second electrode 405' are stacked. The first electrode 401' and the first lower electrode 401 may be formed at the same time, of the same material, in the same structure, and at the same level. The second electrode 405' and the upper electrode 405 may be formed at the same time, of the same material, and at the same level. The second electrode 405' may contact the upper electrode 405 in the first region R1.

FIGS. 6A to 6D are cross-sectional views illustrating another method for fabricating a semiconductor device in accordance with an embodiment of the present invention. FIGS. 6A to 6D illustrate a semiconductor device that includes the capacitor described with reference to FIG. 1 and further includes a supporter disposed in the upper portion of the capacitor and suitable for preventing the capacitor from collapsing. The components illustrated in FIGS. 6A to 6D and indicated by the same reference numerals as in FIG. 1 may be those of the reference numerals.

Figure 6A:
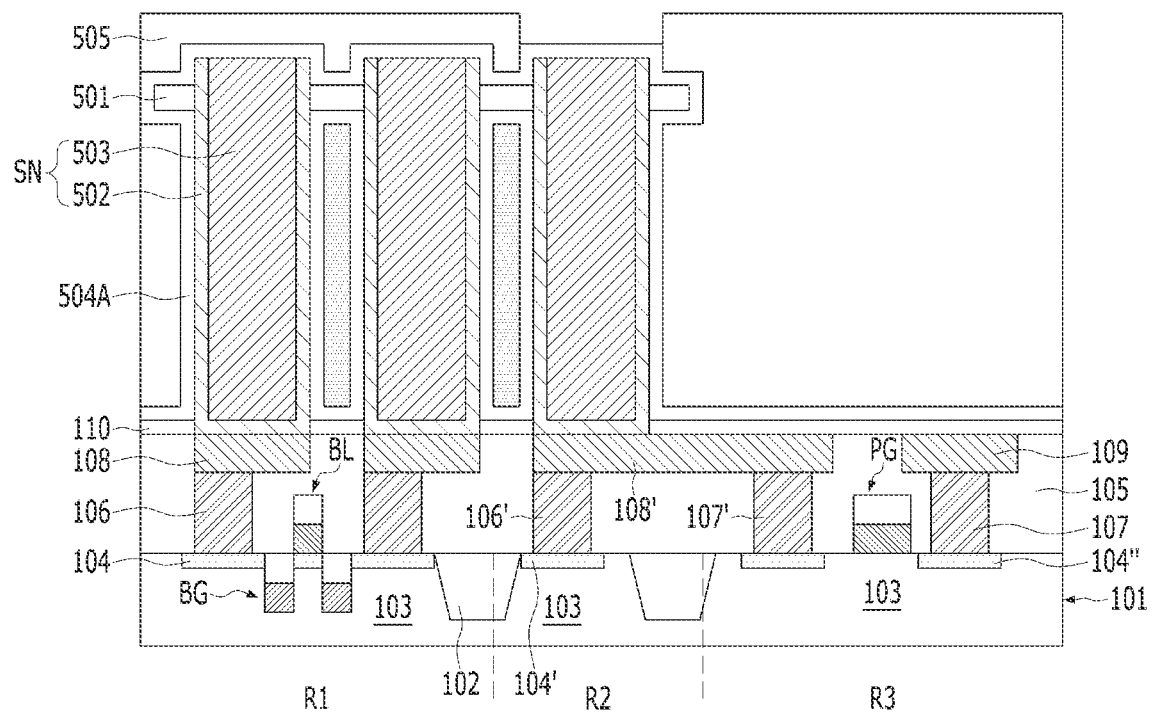

Referring to FIG. 6A, the reference numeral 501 may refer to the supporter. The reference numeral 502 may refer to the first lower electrode. The reference numeral 503 may refer to the second lower electrode. The reference numeral 504A may refer to the dielectric material layer. The reference numeral 505 may refer to the second mask pattern.

The supporter 501 may be formed over or inside the sacrificial layer 111A when the sacrificial layer 111A in FIG. 2A is formed. The supporter 501 may be formed of a silicon nitride or a silicon carbonitride (SiCN). In accordance with an embodiment of the present invention, the supporter 501 is formed over the first lower electrode 502. However, the present invention is not limited there. For example, the supporter 501 may be made of a single level, a double level, a triple level, or a multi-layer level.

The second mask pattern 505 may include an easily removable material. The second mask pattern 505 may include a material having different etch selectivity from the dielectric material layer 504A and the lower electrode SN. The second mask pattern 505 may include an opening that selectively exposes the dielectric material layer 504A formed over the lower electrode SN in the second region R2.

Figure 6B:
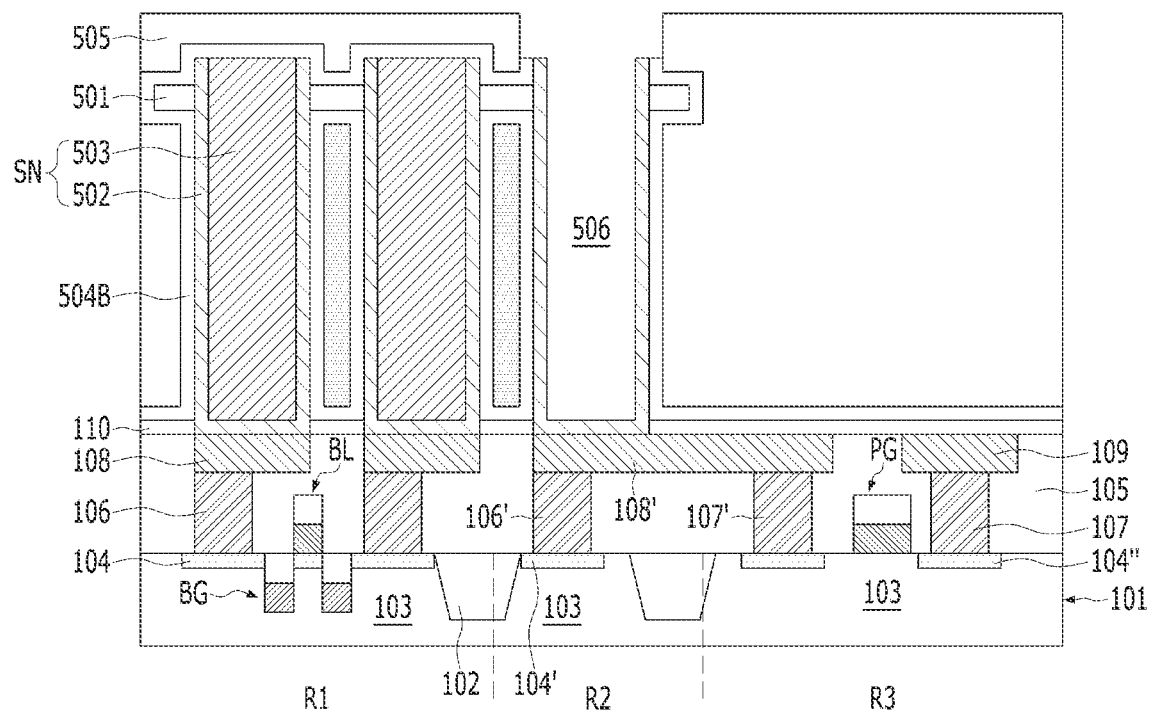

Referring to FIG. 6B, the dielectric material layer 504A (refer to FIG. 6A) and the second lower electrode 503 (refer to FIG. 6A) in the second region R2 exposed by the second mask pattern 505 may be etched. A trench 506 may be defined by the first lower electrode 502 in the second region R2. An etched dielectric material layer is denoted as 504B.

Subsequently, the second mask pattern 505 may be removed.

Figure 6C:
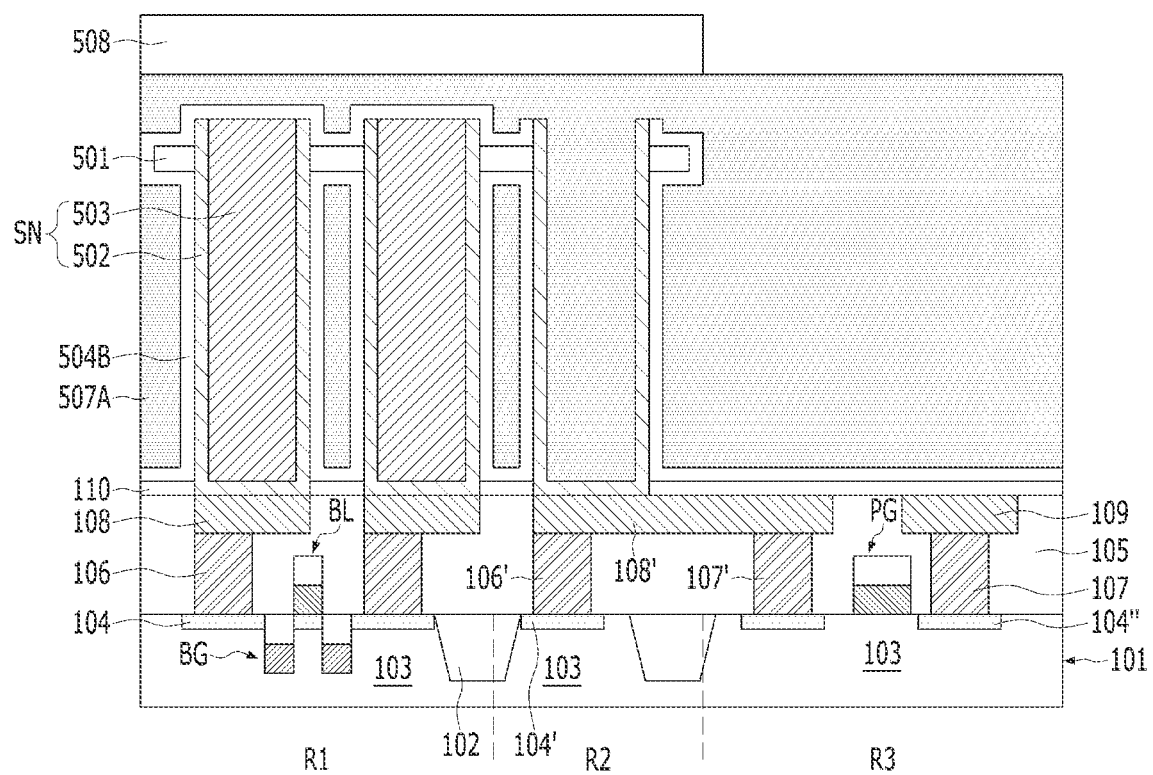

Referring to FIG. 6C, the upper electrode material layer 506A may be formed over the substrate 101 containing the dielectric material layer 504B.

Subsequently, a third mask pattern 508 may be formed over the upper electrode material layer 507A. The third mask pattern 508 may be patterned so that the third region R3 is to be open.

Figure 6D:
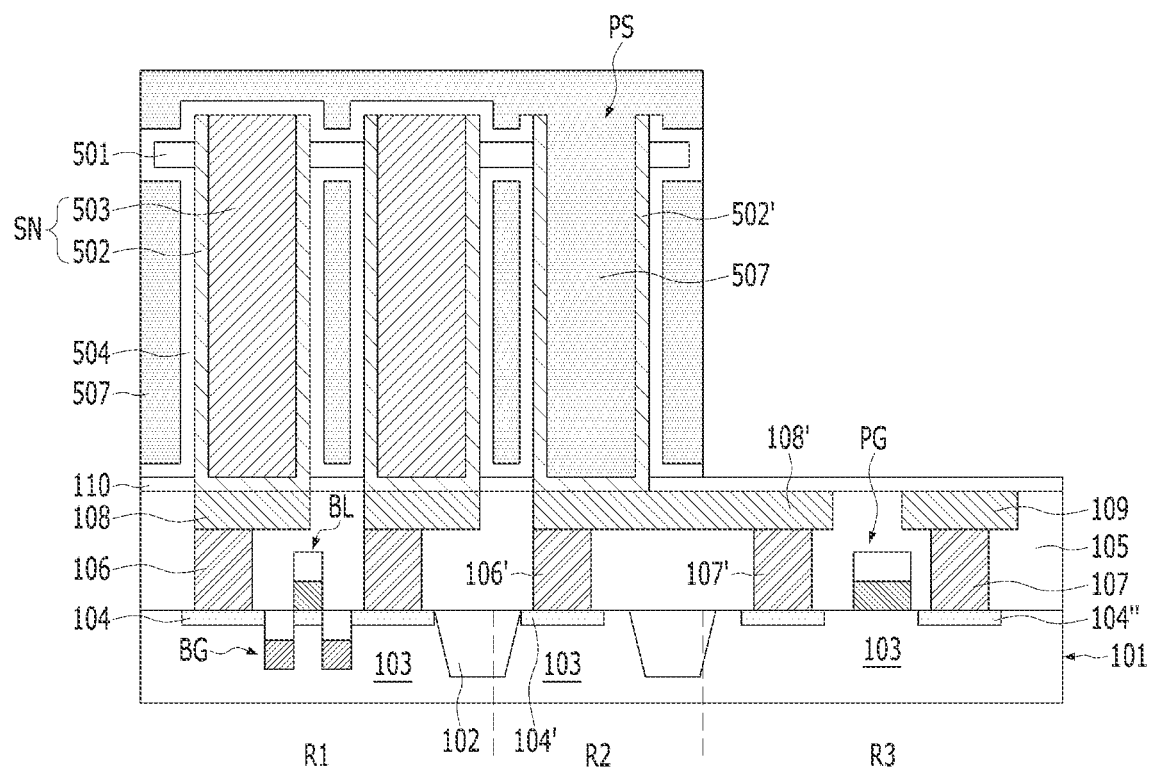

Referring to FIG. 6D, the third mask pattern 508 (refer to FIG. 6C) may be used to etch the upper electrode material layer 507A (refer to FIG. 6C) and the dielectric material layer 504B (refer to FIG. 6C).

Thus, the first region R1 may include a capacitor where the lower electrode SN, the dielectric layer 504, and the upper electrode 507 are stacked. The second region R2 may include a discharge structure PS where the first electrode 502' and the second electrode 507' are stacked. The first electrode 502' and the first lower electrode 502 may be formed at the same time, of the same material, in the same structure, and at the same level. The second electrode 507' and the upper electrode 507 may be formed at the same time, of the same material, and at the same level. The second electrode 507' may contact the upper electrode 507 in the first region R1.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
 a capacitor disposed over a substrate and including a lower electrode, a dielectric layer and an upper electrode; and
 a discharge structure spaced apart from the capacitor, connected to the upper electrode of the capacitor and suitable for discharging, to the substrate, a charge induced from a plasma process for forming the upper electrode of the capacitor,
 wherein the discharge structure includes:
 a second electrode;
 a first electrode connected to the second electrode;
 a discharge contact plug connected to the first electrode; and
 a diode connected to the discharge contact plug and formed in the substrate,
 wherein the discharge contact plug further includes:
 a first discharge contact plug connected to the diode; and
 a second discharge contact plug of which both ends are connected respectively to the first discharge contact plug and the first electrode.

2. The semiconductor device of claim 1, wherein the second electrode is connected to the upper electrode.

3. The semiconductor device of claim 1, further comprising:
 a contact plug of which both ends are connected respectively to the substrate and the capacitor, and
 wherein the discharge contact plug and the contact plug are located at a same level.

4. The semiconductor device of claim 1, wherein the first electrode and the lower electrode have a same structure and located at the same level.

5. The semiconductor device of claim 1, wherein the first electrode, the second electrode, and the second discharge contact plug include a metal.

6. The semiconductor device of claim 1, wherein the first discharge contact plug includes a semiconductor material.

7. The semiconductor device of claim 1, further comprising a metal line connected to the capacitor over the capacitor.

8. The semiconductor device of claim 1, wherein the first electrode is of a cylinder-shape or a pillar-shape.

9. The semiconductor device of claim 1, further comprising a supporter covering an outer wall of the first electrode.

10. A semiconductor device, comprising:
a substrate including a first region and a second region;
a capacitor disposed on the first region of the substrate and including a lower electrode, a dielectric layer and an upper electrode; and
a discharge structure spaced apart from the capacitor, connected to the upper electrode of the capacitor and suitable for discharging, to the second region of the substrate, a charge induced from a plasma process for forming the upper electrode of the capacitor,
wherein the discharge structure includes:
a second electrode;
a first electrode connected to the second electrode;
a discharge contact plug connected to the first electrode; and
a first diode connected to the discharge contact plug and formed in the second region of the substrate,
wherein the discharge contact plug includes:
a first discharge contact plug connected to the first diode; and
a second discharge contact plug of which both ends are connected respectively to the first discharge contact plug and the first electrode.

11. The semiconductor device of claim 10, wherein the second electrode is connected to the upper electrode.

12. The semiconductor device of claim 10,
further comprising
a contact plug of which both ends are connected respectively to the first region of the substrate and the capacitor,
wherein the discharge contact plug and the contact plug are located at a same level.

13. The semiconductor device of claim 10, wherein the discharge contact plug includes:
a first discharge contact plug connected to the first diode; and
a second discharge contact plug of which both ends are connected respectively to the first discharge contact plug and the first electrode.

14. The semiconductor device of claim 10,
wherein
the substrate further includes a third region, and
wherein the discharge structure further includes:
a third discharge contact plug of which both ends are connected to the second discharge contact plug and the third region of the substrate; and
a second diode connected to the third discharge contact plug and formed in the third region of the substrate.

* * * * *